United States Patent
Abe et al.

(10) Patent No.: US 7,935,958 B2
(45) Date of Patent: May 3, 2011

(54) SEMICONDUCTOR DEVICE

(75) Inventors: Hiroko Abe, Setagaya (JP); Yuji Iwaki, Atsugi (JP); Mikio Yukawa, Atsugi (JP); Shunpei Yamazaki, Setagaya (JP); Yasuyuki Arai, Atsugi (JP); Yasuko Watanabe, Atsugi (JP); Yoshitaka Moriya, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1195 days.

(21) Appl. No.: 11/547,632

(22) PCT Filed: Oct. 18, 2005

(86) PCT No.: PCT/JP2005/019450
§ 371 (c)(1),
(2), (4) Date: Oct. 5, 2006

(87) PCT Pub. No.: WO2006/043687
PCT Pub. Date: Apr. 27, 2006

(65) Prior Publication Data
US 2008/0210928 A1    Sep. 4, 2008

(30) Foreign Application Priority Data

Oct. 22, 2004    (JP) .................................. 2004-308839

(51) Int. Cl.
*H01L 29/08* (2006.01)
(52) U.S. Cl. .......... 257/40; 257/288; 257/347; 257/352; 257/E51.005
(58) Field of Classification Search .............. 257/40
See application file for complete search history.

(56) References Cited

U.S. PATENT DOCUMENTS
3,833,894 A    9/1974   Aviram et al.
(Continued)

FOREIGN PATENT DOCUMENTS
EP    1229552    8/2002
(Continued)

OTHER PUBLICATIONS
Office Action (Application No. 200580036324.X) dated May 30, 2008.
(Continued)

*Primary Examiner* — Kenneth A Parker
*Assistant Examiner* — Jose R Diaz
(74) *Attorney, Agent, or Firm* — Eric J. Robinson; Robinson Intellectual Property Law Office, P.C.

(57) ABSTRACT

The present invention provides a semiconductor device which has a storage element having a simple structure in which an organic compound layer is sandwiched between a pair of conductive layers and a manufacturing method of such a semiconductor device. With this characteristic, a semiconductor device having a storage circuit which is nonvolatile, additionally recordable, and easily manufactured and a manufacturing method of such a semiconductor device are provided. A semiconductor device according to the present invention has a plurality of field-effect transistors provided over an insulating layer and a plurality of storage elements provided over the plurality of field-effect transistors. Each of the plurality of field-effect transistors uses a single-crystal semiconductor layer as a channel portion and each of the plurality of storage elements is an element in which a first conductive layer, an organic compound layer, and a second conductive layer are stacked in order.

16 Claims, 22 Drawing Sheets

U.S. PATENT DOCUMENTS

| | | | |
|---|---|---|---|
| 4,839,707 | A | 6/1989 | Shields |
| 5,375,250 | A | 12/1994 | Van den Heuvel |
| 5,536,950 | A | 7/1996 | Liu et al. |
| 5,702,963 | A | 12/1997 | Vu et al. |
| 5,815,223 | A | 9/1998 | Watanabe et al. |
| 5,982,002 | A | 11/1999 | Takasu et al. |
| 6,075,580 | A | 6/2000 | Kouchi |
| 6,096,582 | A | 8/2000 | Inoue et al. |
| 6,320,204 | B1 | 11/2001 | Hirabayashi et al. |
| 6,362,798 | B1 | 3/2002 | Kimura et al. |
| 6,509,217 | B1 | 1/2003 | Reddy |
| 6,518,962 | B2 | 2/2003 | Kimura et al. |
| 6,583,490 | B2 | 6/2003 | Hagiwara et al. |
| 6,617,644 | B1 | 9/2003 | Yamazaki et al. |
| 6,795,339 | B2 | 9/2004 | Ooishi |
| 6,800,527 | B2 | 10/2004 | Hagiwara et al. |
| 6,818,920 | B2 | 11/2004 | De Leeuw et al. |
| 6,828,685 | B2 | 12/2004 | Stasiak |
| 6,831,623 | B2 | 12/2004 | Yasukawa |
| 6,847,047 | B2 | 1/2005 | VanBuskirk et al. |
| 6,847,069 | B2 * | 1/2005 | Park et al. ............... 257/288 |
| 6,847,541 | B2 | 1/2005 | Tsujioka |
| 6,903,958 | B2 | 6/2005 | Bernds et al. |
| 6,962,844 | B2 | 11/2005 | Stasiak |
| 6,977,389 | B2 | 12/2005 | Tripsas et al. |
| 7,016,222 | B2 | 3/2006 | Morikawa |
| 7,161,176 | B2 | 1/2007 | Yamazaki et al. |
| 7,220,985 | B2 | 5/2007 | Cheung et al. |
| 7,227,178 | B2 | 6/2007 | Kawakami et al. |
| 7,271,076 | B2 | 9/2007 | Yamazaki et al. |
| 7,499,305 | B2 | 3/2009 | Nomura et al. |
| 2002/0196657 | A1 | 12/2002 | Katoh |
| 2003/0006699 | A1* | 1/2003 | Ogino et al. ............ 313/506 |
| 2003/0080338 | A1* | 5/2003 | Yamazaki et al. .......... 257/59 |
| 2003/0156449 | A1 | 8/2003 | Ooishi |
| 2003/0227793 | A1 | 12/2003 | Tsujioka |
| 2003/0230746 | A1 | 12/2003 | Stasiak |
| 2004/0130939 | A1 | 7/2004 | Morikawa |
| 2004/0164302 | A1 | 8/2004 | Arai et al. |
| 2004/0238864 | A1 | 12/2004 | Tripsas et al. |
| 2005/0017370 | A1 | 1/2005 | Stasiak |
| 2005/0073883 | A1 | 4/2005 | Anthony |
| 2005/0174875 | A1 | 8/2005 | Katoh |
| 2006/0121670 | A1 | 6/2006 | Stasiak |
| 2006/0157772 | A1 | 7/2006 | Sumida et al. |
| 2006/0267068 | A1 | 11/2006 | Sato et al. |
| 2007/0153565 | A1 | 7/2007 | Nomura et al. |
| 2007/0194301 | A1 | 8/2007 | Sezi et al. |
| 2007/0230235 | A1 | 10/2007 | Abe et al. |
| 2008/0048180 | A1 | 2/2008 | Abe et al. |
| 2009/0121874 | A1 | 5/2009 | Nomura et al. |

FOREIGN PATENT DOCUMENTS

| | | |
|---|---|---|
| EP | 1 441 361 | 7/2004 |
| EP | 1441361 | 7/2004 |
| EP | 1594176 | 11/2005 |
| JP | 62-259478 | 11/1987 |
| JP | 02-058264 | 2/1990 |
| JP | 11-112060 | 4/1999 |
| JP | 2000-113152 | 4/2000 |
| JP | 2001-189431 | 7/2001 |
| JP | 2002-026283 | 1/2002 |
| JP | 2002-231899 | 8/2002 |
| JP | 2003-243631 | 8/2003 |
| JP | 2003-529223 | 9/2003 |
| JP | 2004-509458 | 3/2004 |
| JP | 2004-185755 | 7/2004 |
| JP | 2004-282050 | 10/2004 |
| WO | WO 01/73845 | 10/2001 |
| WO | WO 03/107426 | 12/2003 |
| WO | WO 2004/015778 | 2/2004 |
| WO | WO 2004/073079 | 8/2004 |

OTHER PUBLICATIONS

International Search Report (Application No. PCT/JP2005/019450) Dated Dec. 27, 2005.

Written Opinion (Application No. PCT/JP2005/019450) Dated Dec. 27, 2005.

* cited by examiner

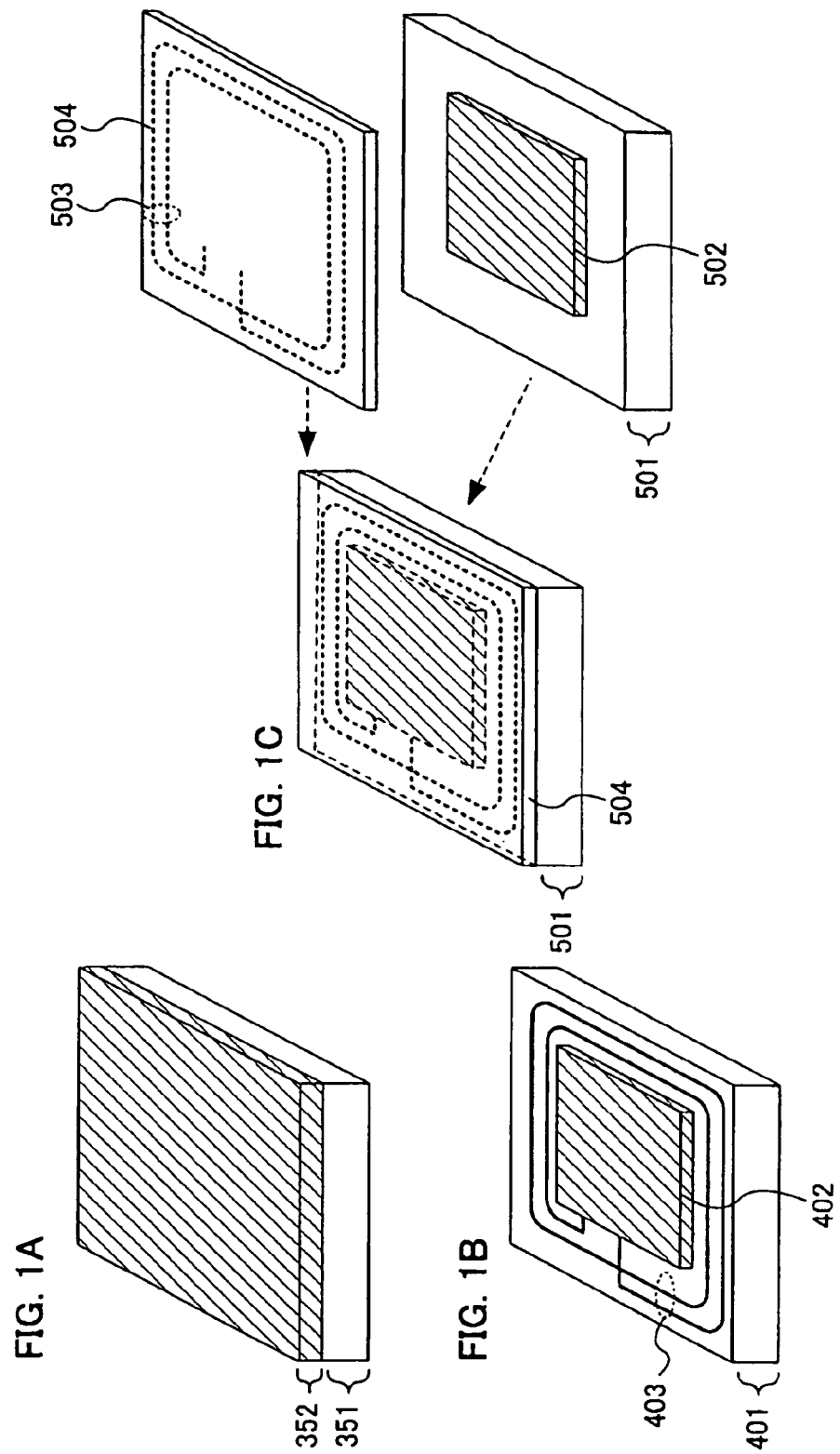

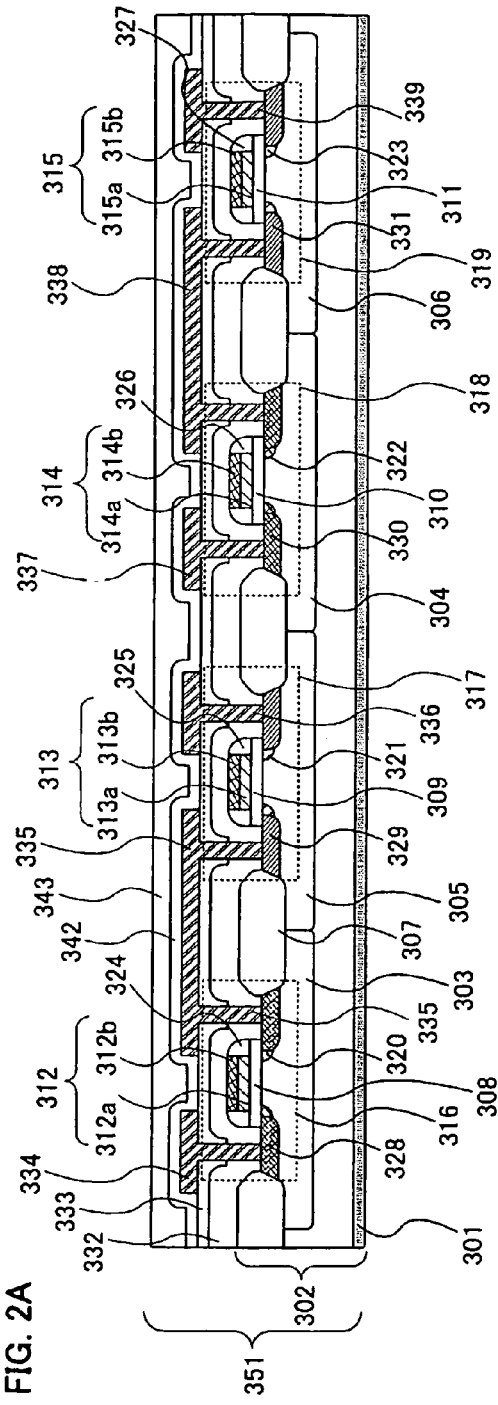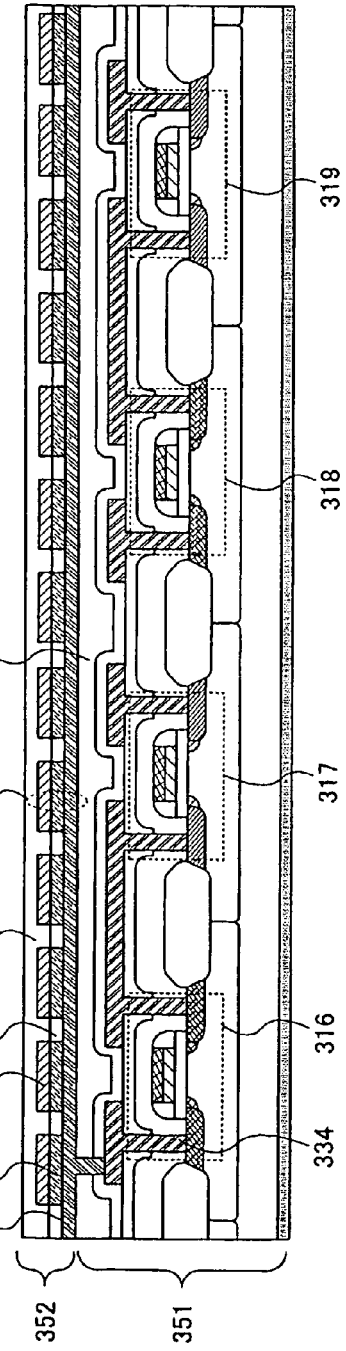
FIG. 2A
FIG. 2B

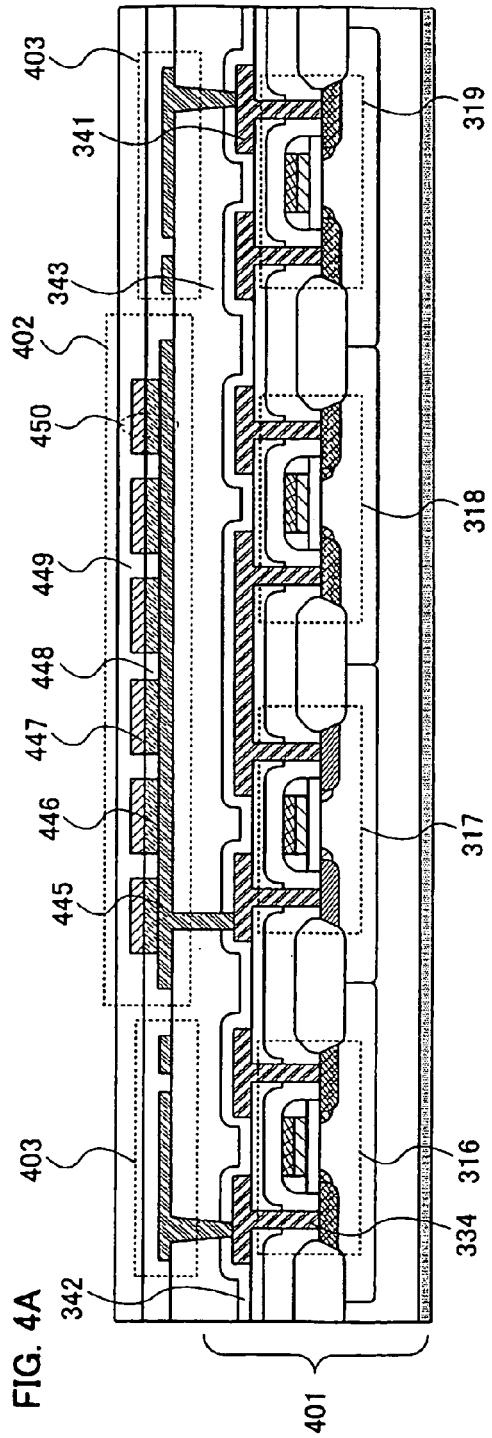
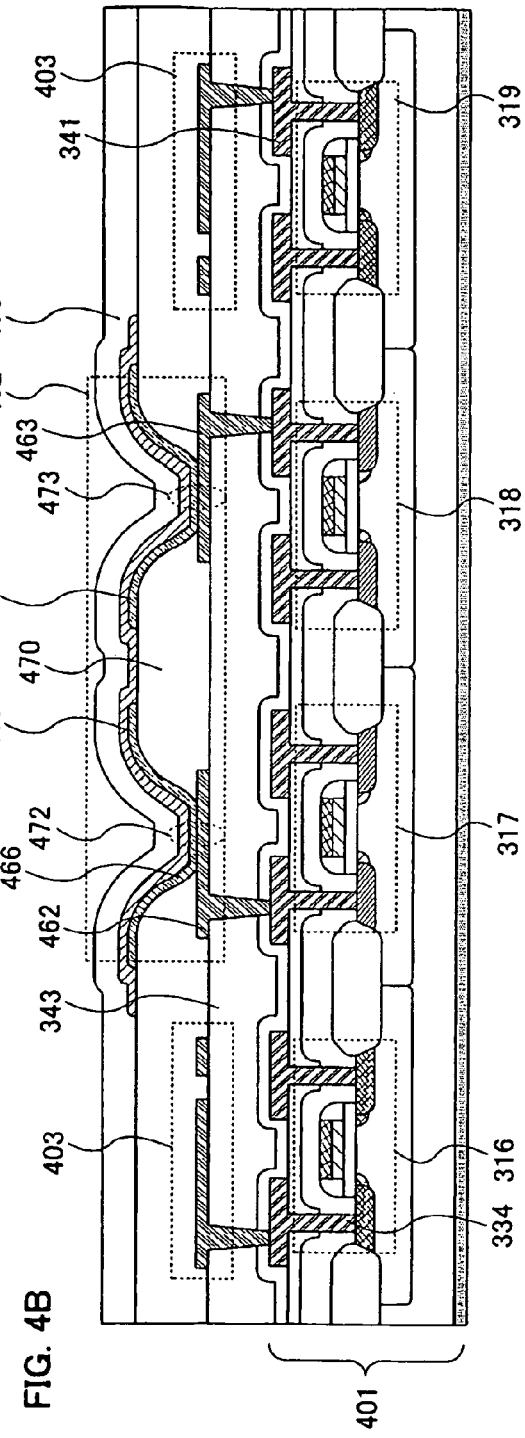
FIG. 4A
FIG. 4B

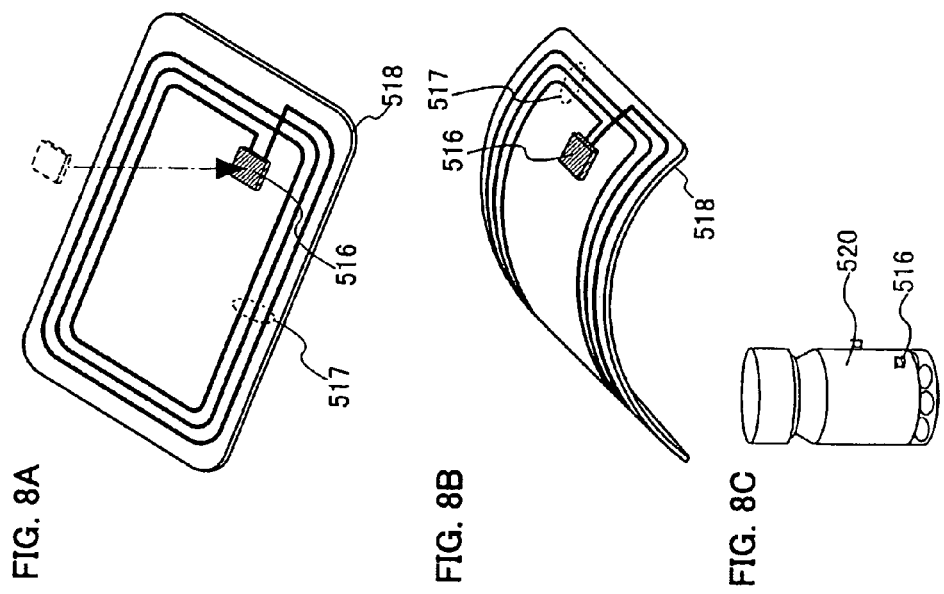

○ : before shorting    □ : after shorting

○ : before shorting    □ : after shorting

○ : before shorting    □ : after shorting

US 7,935,958 B2

SEMICONDUCTOR DEVICE

TECHNICAL FIELD

The present invention relates to a semiconductor device in which a plurality of circuits are integrated and also relates to a manufacturing method thereof. Moreover, the present invention relates to a semiconductor device which can send and receive data and also relates to a manufacturing method thereof.

BACKGROUND ART

In recent years, development has been advanced on a semiconductor device having various functions in which a plurality of circuits are integrated over an insulating surface. Further, development has been advanced on a semiconductor device which can send and receive data wirelessly by providing an antenna. Such a semiconductor device is referred to as a wireless chip, an ID tag, an IC chip, an RF (Radio Frequency) tag, a wireless tag, an electronic tag, or an RFID (Radio Frequency Identification), and has already been introduced into some markets (For example, see Reference 1: Japanese Patent Application Laid-Open No. 2004-282050).

DISCLOSURE OF INVENTION

A more sophisticated and higher-value-added semiconductor device can be provided when a storage circuit (also referred to as a memory, simply) for storing data is provided as one of various circuits to be integrated over a substrate. The storage circuit is, for example, a DRAM, an SRAM, an FeRAM, a mask ROM, an EPROM, an EEPROM, a flash memory, or the like. Among these, since a DRAM and an SRAM are volatile storage circuits in which data are erased by turning off the power, data need to be written every time the power is turned on. Meanwhile, an FeRAM is a nonvolatile storage circuit. Since an FeRAM uses a capacitor element including a ferroelectric layer, a number of manufacturing steps thereof is high. Although a mask ROM has a simple structure, data need to be written in a manufacturing step and data cannot be additionally recorded. An EPROM, an EEPROM, and a flash memory are nonvolatile storage circuits; however, numbers of manufacturing steps of them are high because an element including two gate electrodes is used.

In view of the above problems, it is an object of the present invention to provide a semiconductor device having a nonvolatile and additionally recordable storage circuit which can be easily manufactured and to provide a manufacturing method thereof.

The present invention is to provide a semiconductor device including a storage element which has a simple structure where an organic compound layer is sandwiched between a pair of conductive layers and to provide a manufacturing method thereof. With this characteristic, a semiconductor device having a nonvolatile and additionally recordable storage circuit which can be easily manufactured and a manufacturing method thereof are provided.

A semiconductor device in accordance with the present invention includes a plurality of field-effect transistors provided over an insulating layer and a plurality of storage elements provided over the plurality of field-effect transistors. Each of the plurality of field-effect transistors uses a single-crystal semiconductor layer as a channel portion. Each of the plurality of storage elements is formed by stacking a first conductive layer, an organic compound layer, and a second conductive layer in order.

A semiconductor device in accordance with the present invention includes a plurality of field-effect transistors provided over an insulating layer, a plurality of storage elements provided over the plurality of field-effect transistors, and a conductive layer serving as an antenna. Each of the plurality of field-effect transistors uses a single-crystal semiconductor layer as a channel portion. Each of the plurality of storage elements is formed by stacking a first conductive layer, an organic compound layer, and a second conductive layer in order. The conductive layer serving as the antenna and the first conductive layer are provided in the same layer.

A semiconductor device in accordance with the present invention comprises a plurality of field-effect transistors provided over an insulating layer, a plurality of storage elements provided over the plurality of field-effect transistors, and a substrate where a conductive layer serving as an antenna is provided. Each of the plurality of field-effect transistors uses a single-crystal semiconductor layer as a channel portion. Each of the plurality of storage elements is formed by stacking a first conductive layer, an organic compound layer, and a second conductive layer. The conductive layer serving as the antenna and a conductive layer serving as a source wiring or a drain wiring of the field-effect transistor are connected through a conductive particle.

In the semiconductor device of the present invention having the above structure, the insulating layer may be a silicon oxide layer. Moreover, the storage element may change in its conductivity by an optical action, may change its resistance value by an optical action, and may change its resistance value by an electric action. The organic compound layer in the storage element may include a conjugate polymer material doped with a photoacid generator. The organic compound layer may include an electron-transporting material or a hole-transporting material.

A semiconductor device in accordance with the present invention includes one or a plurality of field-effect transistors each of which uses a single-crystal semiconductor layer provided over an insulating layer as a channel portion and one or a plurality of storage elements each of which has an organic compound layer between a pair of conductive layers provided over the field-effect transistors. In the semiconductor device having the above structure, in the case where the plurality of storage elements are arranged in a passive matrix form, one of the pair of conductive layers in each of the storage elements is used in common among the plurality of storage elements and electrically connected to a source region or a drain region of the field-effect transistor. Meanwhile, in the case where the plurality of storage elements are provided in an active matrix form, one of the pair of conductive layers in each of the plurality of storage elements is electrically connected to a source region or a drain region of one field-effect transistor selected from the plurality of field-effect transistors and each of the plurality of storage elements is electrically connected to each of the field-effect transistors.

A semiconductor device in accordance with the present invention includes one or a plurality of field-effect transistors each of which uses a single-crystal semiconductor layer provided over an insulating layer as a channel portion, one or a plurality of storage elements each of which has an organic compound layer between a pair of conductive layers provided over the field-effect transistors, and a conductive layer serving as an antenna, wherein one of the pair of conductive layers and the conductive layer serving as the antenna are provided in the same layer. In the semiconductor device having the above structure, in the case where the plurality of storage elements are arranged in a passive matrix form, one of the pair of conductive layers in each of the plurality of storage elements is used in common among the plurality of storage elements and electrically connected to a source region or a drain region of the field-effect transistor. Meanwhile, in the case where the plurality of storage elements are provided in an active matrix form, one of the pair of conductive layers in each of the plurality of storage elements is electrically connected to a source region or a drain region of one field-effect transistor selected from the plurality of field-effect transistors and each of the plurality of storage elements is electrically connected to each of the field-effect transistors.

A semiconductor device in accordance with the present invention includes one or a plurality of field-effect transistors each of which uses a single-crystal semiconductor layer provided over an insulating layer as a channel portion, one or a plurality of storage elements each of which has an organic compound layer between a pair of conductive layers provided over the field-effect transistors, and a substrate which is provided over the storage elements and where a conductive layer serving as an antenna is provided, wherein the conductive layer serving as the antenna is electrically connected to a source region or a drain region of the field-effect transistor. In the semiconductor device having the above structure, in the case where the plurality of storage elements are arranged in a passive matrix form, one of the pair of conductive layers in each of the plurality of storage elements is used in common among the plurality of storage elements and electrically connected to a source region or a drain region of the field-effect transistor. Meanwhile, in the case where the plurality of storage elements are provided in an active matrix form, one of the pair of conductive layers in each of the plurality of storage elements is electrically connected to a source region or a drain region of one field-effect transistor selected from the plurality of field-effect transistors and each of the plurality of storage elements is electrically connected to each of the field-effect transistors.

A semiconductor device in accordance with the present invention includes a field-effect transistor which is provided over a first insulating layer and uses a single-crystal semiconductor layer as a channel portion, a second insulating layer which covers the field-effect transistor, a first conductive layer (corresponding to a source wiring or a drain wiring) connected to a source region or a drain region of the field-effect transistor through an opening portion provided in the second insulating layer, a third insulating layer provided over the second insulating layer and the first conductive layer, a second conductive layer connected to the first conductive layer through an opening portion provided in the third insulating layer, an organic compound layer in contact with the second conductive layer, and a third conductive layer in contact with the organic compound layer. A multilayer body including the second conductive layer, the organic compound layer, and the third conductive layer is a storage element.

A semiconductor device in accordance with the present invention includes a field-effect transistor which is provided over a first insulating layer and uses a single-crystal semiconductor layer as a channel portion, a second insulating layer which covers the field-effect transistor, a first conductive layer (corresponding to a source wiring or a drain wiring) connected to a source region or a drain region of the field-effect transistor through an opening portion provided in the second insulating layer, a third insulating layer provided over the second insulating layer and the first conductive layer, a second conductive layer and a third conductive layer connected to the first conductive layer through an opening portion provided in the third insulating layer, an organic compound layer in contact with the second conductive layer, and a fourth conductive layer in contact with the organic compound layer. A multilayer body including the second conductive layer, the organic compound layer, and the fourth conductive layer is a storage element, and the third conductive layer is an antenna.

A semiconductor device in accordance with the present invention includes a field-effect transistor which is provided over a first insulating layer and uses a single-crystal semiconductor layer as a channel portion, a second insulating layer which covers the field-effect transistor, a first conductive layer (corresponding to a source wiring or a drain wiring) connected to a source region or a drain region of the field-effect transistor through an opening portion provided in the second insulating layer, a third insulating layer provided over the second insulating layer and the first conductive layer, a second conductive layer connected to the first conductive layer through an opening portion provided in the third insulating layer, an organic compound layer in contact with the second conductive layer, a third conductive layer in contact with the organic compound layer, a fourth conductive layer electrically connected to the first conductive layer, and a substrate provided over the fourth conductive layer. A multilayer body including the second conductive layer, the organic compound layer, and the third conductive layer is a storage element, and the fourth conductive layer is an antenna.

In the display device having the above structure, the storage element is an element in which distance between the pair of conductive layers changes by an electric action. The distance between the pair of conductive layers in the storage element changes when data are written in the storage element by an electric action that shorts the pair of conductive layers of the storage element. Specifically, after shorting the pair of conductive layers, the distance between the pair of conductive layers becomes smaller than before shorting the pair of conductive layers.

The organic compound layer has at least a carrier-transporting material because it is necessary to flow current by transporting carriers when data are written by an electric action. Moreover, the organic compound layer has a carrier-transporting material with a conductance of $1.0 \times 10^{-15}$ S·cm$^{-1}$ to $1.0 \times 10^{-3}$ S·cm$^{-1}$ preferably.

The thickness of the organic compound layer ranges preferably from 5 to 60 nm, preferably from 10 to 20 nm for the following reasons: the thickness is difficult to be controlled and likely to vary when the thickness is less than 5 nm; and the power consumption required for writing data by an electric action is high when the thickness of the organic compound layer is more than 60 mm. In the preferable range of 10 to 20 nm, the thickness of the organic compound layer is unlikely to vary and the power consumption can be suppressed further. The substrate may have flexibility.

The semiconductor device of the present invention having the above structure further includes one or more selected from a power source circuit, a clock generation circuit, a data modulation/demodulation circuit, and an interface circuit.

A method for manufacturing a semiconductor device in accordance with the present invention employs a substrate where a first single-crystal semiconductor layer, an insulating layer including a silicon oxide layer, and a second single-crystal semiconductor layer are stacked in order, and includes the steps of forming a plurality of field-effect transistors each of which uses the first single-crystal semiconductor layer provided over one surface of the substrate as a channel portion, forming a plurality of storage elements including a multilayer body of a first conductive layer, an organic conductive layer, and a second conductive layer over the plurality of field-effect transistors, and etching the second single-crystal semiconductor layer provided over a surface of the substrate opposite to the one surface thereof. The organic compound layer is formed by a droplet-discharging method.

In accordance with the present invention, a field-effect transistor uses a single-crystal semiconductor layer as a channel portion. Since the field-effect transistor is superior in its characteristic such as response speed and mobility, a semiconductor device capable of high-speed operation and a manufacturing method thereof can be provided. Since the variation in the characteristics of the field-effect transistors using single-crystal semiconductor is little, a semiconductor device with high reliability and a manufacturing method thereof can be provided.

In a semiconductor device in accordance with the present invention, a layer including a plurality of storage elements is stacked over a layer including a plurality of field-effect transistors each of which uses a single-crystal semiconductor layer as a channel portion. With this characteristic, a small semiconductor device can be provided.

In accordance with the present invention, a storage element has a simple structure in which an organic compound layer is sandwiched between a pair of conductive layers. With this characteristic, a semiconductor device which is inexpensive because the semiconductor device can be easily manufactured and a manufacturing method thereof can be provided. Furthermore, since high integration is easy, a semiconductor device having a high-capacity storage circuit and a manufacturing method of such a semiconductor device can be provided.

The storage circuit in the semiconductor device in accordance with the present invention is nonvolatile and additionally recordable in which data are written by an optical action or an electric action. With this characteristic, forgery by rewriting can be prevented and new data can be written additionally. That is to say, the present invention can provide a semiconductor device having a storage circuit in which data cannot be rewritten. Therefore, a sophisticated and high-value-added semiconductor device and a manufacturing method thereof can be provided.

A method for manufacturing a semiconductor device in accordance with the present invention employs a substrate where a first single-crystal semiconductor layer, an insulating layer, and a second single-crystal semiconductor layer are stacked, and includes the steps of forming a plurality of transistors each of which uses the first single-crystal semiconductor layer as a channel portion and etching away the second single-crystal semiconductor layer. With this manufacturing method, a small, thin, and lightweight semiconductor device can be provided.

BRIEF DESCRIPTION OF DRAWINGS

In the accompanying drawings:

FIGS. 1A to 1C describe a semiconductor device of the present invention;

FIGS. 2A and 2B describe a semiconductor device of the present invention;

FIGS. 4A and 4B describe a semiconductor device of the present invention;

FIGS. 8A to 8C describe a semiconductor device of the present invention;

BEST MODE FOR CARRYING OUT THE INVENTION

Figure 3:
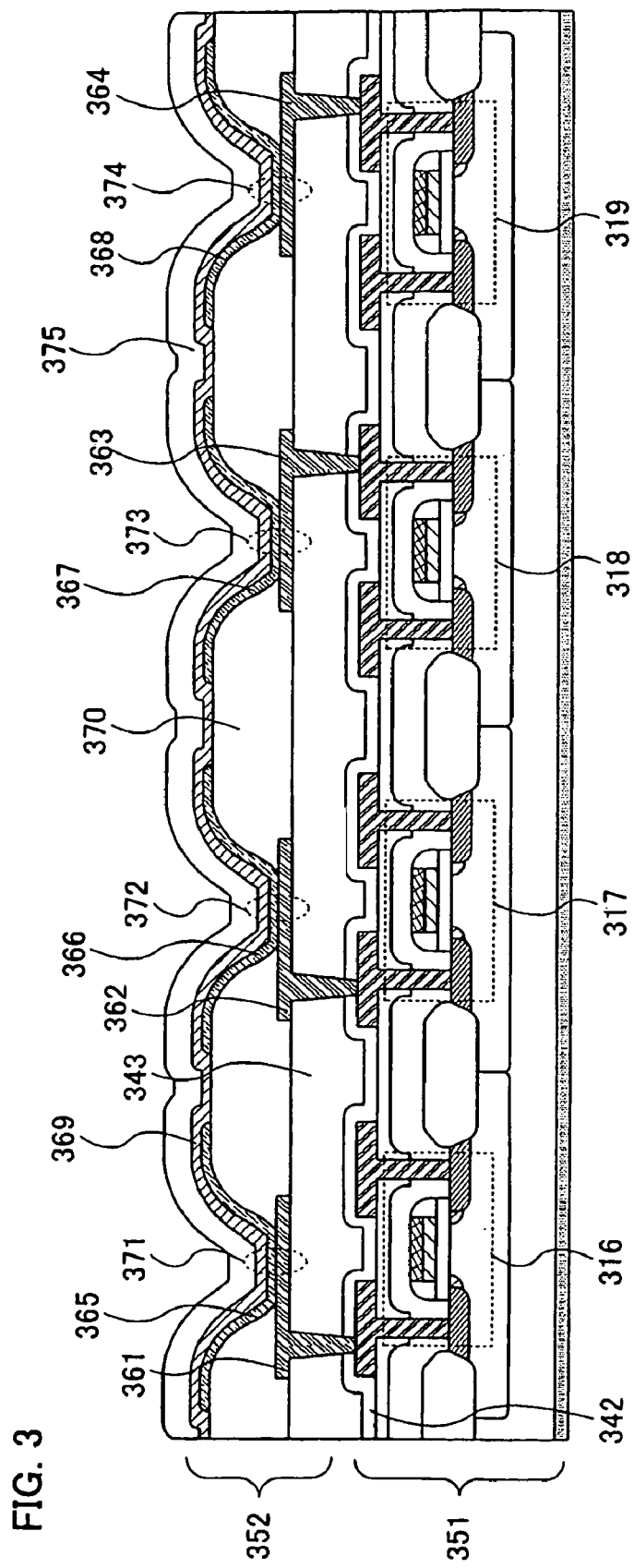
FIG. 3 describes a semiconductor device of the present invention.

Embodiment Modes and Embodiments of the present invention will be described with reference to the drawings. However, the present invention is not limited to the following description, and it is easily understood by those skilled in the art that the modes and the details can be changed variously without departing from the scope and the spirit of the present invention. Therefore, the present invention is not construed as being limited by the description of Embodiment Modes and Embodiments hereinafter shown. In the structures of the present invention hereinafter described, the same reference numerals indicating the same things are used in common through the drawings. In the description below, a field-effect transistor may be described as an FET for short.

Embodiment Mode 1

A structure of a semiconductor device in accordance with the present invention will be described with reference to the drawings. The semiconductor device in accordance with the present invention has a structure in which a plurality of circuits are integrated. More specifically, the semiconductor device in accordance with the present invention has a structure in which a layer 351 including a plurality of field-effect transistors and a layer 352 including a plurality of storage elements are stacked in order (refer to FIG. 1A). The layer 351 including the plurality of field-effect transistors constitutes various circuits. Further, the layer 352 including the plurality of storage elements constitutes a storage circuit for storing data.

A cross-sectional structure of a semiconductor device of the present invention having the above structure is described.

First, a cross-sectional structure of only the layer 351 including the plurality of field-effect transistors is described (refer to FIG. 2A). A single-crystal semiconductor layer 302 is provided over an insulating layer 301. In the single-crystal semiconductor layer 302, p wells 303 and 305 and n wells 304 and 306 are formed in a self-aligning manner, which are separated by field oxide layers 307. Gate insulating layers 308 to 311 are layers formed by thermal oxidation. Gates 312 to 315 contains polycrystalline silicon layers 312a to 315a each having a thickness from 100 to 300 nm and silicide layers 312b to 315b having a thickness from 50 to 300 nm by CVD. Sidewalls 324 to 327 are formed in such a way that after forming an insulating layer all over the surface, parts of the insulating layer are left at side walls of the gates 312 to 315 by anisotropic etching.

A semiconductor device in accordance with the present invention has a structure in which the single-crystal semiconductor layer 302 is stacked over the insulating layer 301 for the following reason. In the present invention, a substrate (SIMOX substrate) where a first single-crystal semiconductor layer, an insulating layer, and a second single-crystal semiconductor layer are stacked in order is used and, in a step of manufacturing a semiconductor device in accordance with the present invention, after manufacturing a field-effect transistor which uses the first single-crystal semiconductor layer (corresponding to the single-crystal semiconductor layer 302) as a channel portion, the second single-crystal semiconductor layer is etched away. The present invention having the above characteristic can provide a small, thin, and lightweight semiconductor device.

In an impurity region (also referred to as a source region or a drain region) 328 of a p-channel FET 316 and an impurity region 330 of a p-channel FET 318 are doped with an impurity element imparting p-type conductivity. In an impurity region 329 of an n-channel FET 317 and an impurity region 331 of an n-channel FET 319 are doped with an impurity element imparting n-type conductivity.

A low-concentration impurity region (also referred to as an LDD region) 320 of the p-channel FET 316 and a low-concentration impurity region 322 of the p-channel FET 318 are doped with an impurity element imparting p-type conductivity. A low-concentration impurity region 321 of the n-channel FET 317 and a low-concentration impurity region 323 of the n-channel FET 319 are doped with an impurity element imparting n-type conductivity. These low-concentration impurity regions 320 to 323 are formed in a self-aligning manner by an ion implantation method or an ion doping method.

Although the structure is shown here in which the FETs 316 to 319 have the low-concentration impurity regions 320 to 323 and the sidewalls 324 to 327, the present invention is not limited to this structure. The low-concentration impurity region and the sidewall do not have to be provided if not necessary. Moreover, although the FETs 316 to 319 are separated by the field oxide layers 307, the present invention is not limited to this structure. The elements may be separated by shaping the single-crystal semiconductor layer 302 into a form of islands. In other words, the elements may be separated by patterning the single-crystal semiconductor layer 302 so that the single-crystal semiconductor layer 302 is divided into a form of islands.

Further, insulating layers 332 and 333 are provided so as to cover the p-channel FETs 316 and 318 and the n-channel FETs 317 and 319. These insulating layers 332 and 333 are provided so as to planarize the surface. Conductive layers 334 to 339 serving as source wirings or drain wirings are in contact with the impurity regions 328 to 331 and fill contact holes provided in the insulating layers 332 and 333. Then, insulating layers 342 and 343 are provided so as to cover the conductive layers 334 to 339. These insulating layers 342 and 343 are provided to planarize the surface and to protect the FETs 316 to 319.

As described later, in the layer 352 including the plurality of storage elements provided over the FETs 316 to 319, data are written by an optical action using laser light depending on the structure of the layer 352. In such a case, the insulating layers 342 and 343 are formed with an insulating material having a light-blocking property to protect the FETs 316 to 319 from the laser light. As the insulating material having the light-blocking property, for example, the following materials are given: a known insulating material in which a carbon particle, a metal particle, a pigment, a coloring material, or the like is added and mixed and then, if necessary, filtered; or a material to which a surface-active agent or a dispersive agent is added so that the carbon particle or the like is mixed uniformly. Such an insulating material is preferably formed by a spin coating method.

In a semiconductor device according to the present invention, the layer 352 including a plurality of storage elements is provided over the layer 351 including a plurality of field-effect transistors having the above structure, and the cross-sectional structure is described (refer to FIG. 2B).

A first conductive layer 345, an organic compound layer 346, and a second conductive layer 347 are stacked in order over the insulating layer 343, and this multilayer body corresponds to a storage element 350. An insulating layer 348 is provided between the organic compound layers 346. An insulating layer 349 is provided over the plurality of storage elements 350. The first conductive layer 345 is connected to the conductive layer 334 serving as a source wiring or a drain wiring of the FET 316.

In the semiconductor device having the above structure, the storage element 350 has a simple structure in which the organic compound layer 346 is sandwiched between a pair of conductive layers (the first conductive layer 345 and the second conductive layer 347). With this characteristic, a semiconductor device which is inexpensive and a manufacturing method thereof can be provided because the semiconductor device can be easily manufactured. Further, since high integration is easy, a semiconductor device having a high-capacity storage circuit and a manufacturing method of such a semiconductor device can be provided.

Next, a semiconductor device in which the layer 352 including a plurality of storage elements is provided over the layer 351 including a plurality of field-effect transistors and which has a different cross-sectional structure from the above one is described with reference to FIG. 3. First conductive layers 361 to 364 are provided over the insulating layer 343, and organic compound layers 365 to 368 are provided so as to contact the first conductive layers 361 to 364. Then, a second conductive layer 369 is provided so as to contact the organic compound layers 365 to 368. Each of the first conductive layers 361 to 364 is connected to a conductive layer serving as a source wiring or a drain wiring of each of the FETs 316 to 319. A multilayer body including any one of the first conductive layers 361 to 364, any one of the organic compound layers 365 to 368, and the second conductive layer 369 corresponds to one of storage elements 371 to 374. Between the organic compound layers 365 to 368, an insulating layer 370 is provided. An insulating layer 375 is provided over the plurality of storage elements 371 to 374.

The operation of each of the plurality of storage elements 371 to 374 is controlled by any one of the FETs 316 to 319. In the illustrated structure, all of the FETs 316 to 319 have the same conductivity type, and here the FETs 316 to 319 are n-channel FETs.

Embodiment Mode 2

A structure of a semiconductor device in accordance with the present invention which has a function to send and receive data in a non-contact way will be described with reference to FIGS. 1A to 1C, FIGS. 4A and 4B, and FIG. 5.

A semiconductor device in accordance with the present invention has a structure in which a plurality of circuits are integrated and has a structure in which a layer 401 including a plurality of field-effect transistors and a layer 402 including a plurality of storage elements are stacked in order and a conductive layer 403 serving as an antenna is provided around the layer 402 including the plurality of storage elements (refer to FIG. 1B).

Next, a cross-sectional structure of a semiconductor device having the above structure is described (FIG. 4A). The layer 401 including a plurality of field-effect transistors has a p-channel FET 316, an n-channel FET 317, a p-channel FET 318, and an n-channel FET 319. Since these FET structures are as mentioned above, description is omitted here. Then, the insulating layers 342 and 343 are provided so as to cover the p-channel FET 316, the n-channel FET 317, the p-channel FET 318, and the n-channel FET 319. Over the insulating layer 343, the layer 402 including the plurality of storage elements is provided. In the periphery of the layer 402 including the plurality of storage elements, the conductive layer 403 serving as the antenna is provided.

Then, a first conductive layer 445, an organic compound layer 446, and a second conductive layers 447 are stacked in order over the insulating layer 343, and this multilayer body corresponds to a storage element 450. Between the organic compound layers 446, an insulating layer 448 is provided. The first conductive layer 445 is connected to the conductive layer serving as a source wiring or a drain wiring of the FET 317.

The conductive layer 403 serving as the antenna is provided in the same layer as the first conductive layer 445. Over the conductive layer 403, the insulating layer 448 and an insulating layer 449 are provided. The conductive layer 403 is connected to the conductive layer 334 and a conductive layer 341. The conductive layer 334 serves as a source wiring or a drain wiring of the p-channel FET 316, and the conductive layer 341 serves as a source wiring or a drain wiring of the n-channel FET 319.

In the semiconductor device having the above structure, the storage element 450 has a simple structure in which the organic compound layer 446 is sandwiched between a pair of conductive layers (the first conductive layer 445 and the second conductive layer 447). With this characteristic, a semiconductor device which is inexpensive can be provided because the semiconductor device can be easily manufactured and a manufacturing method thereof. Further, since high integration is easy, a semiconductor device having a high-capacity storage circuit and a manufacturing method of such a semiconductor device can be provided.

Next, a cross-sectional structure of a semiconductor device different from the above one is described with reference to FIG. 4B. More specifically, a cross-sectional structure of a semiconductor device having a different structure from the semiconductor device shown in FIG. 4A only in the structure of the layer 402 including the plurality of storage elements is described.

Over the insulating layer 343, first conductive layers 462 and 463 are provided so as to connect to the conductive layer serving as the source wirings or the drain wirings of the FETs 317 and 318; organic compound layers 466 and 467 are provided so as to contact the first conductive layers 462 and 463; and a second conductive layer 469 is provided so as to contact the organic compound layers 466 and 467. A multilayer body including the second conductive layer 469, either one of the first conducive layers 462 and 463, and either one of the organic compound layers 466 and 467 corresponds to a storage element 472 or 473. Between the organic compound layers 466 and 467, an insulating layer 470 is provided. Over the plurality of storage elements 472 and 473, an insulating layer 475 is provided.

Subsequently, a structure of a semiconductor device of the present invention having a different structure from the above one is described with reference to the drawings.

A semiconductor device of the present invention has a structure in which a plurality of circuits are integrated and has a structure in which two substrates are adhered to each other. Over one substrate, a layer 501 including a plurality of field-effect transistors and a layer 502 including a plurality of storage elements are stacked in order. On the other substrate 504, a conductive layer 503 serving as an antenna is provided (refer to FIG. 1C).

Consequently, a cross-sectional structure of a semiconductor device of the present invention having the structure shown in FIG. 1C is described with reference to FIG. 5.

The layer 501 including the plurality of field-effect transistors has the FETs 316 to 319, and the structures of these FETs are as described above. Further, the layer 502 including the plurality of storage elements has the same structure as the layer 402 including the plurality of storage elements shown in FIG. 4A. For this reason, description of the cross-sectional structure of the layer 502 including the plurality of storage elements is omitted here.

The substrate which has the layer 501 including the plurality of field-effect transistors and the layer 502 including the plurality of storage elements and the substrate 504 where the conductive layer 503 is provided are adhered to each other by resin 505 including a conductive particle 506. Then, the conductive layer 334 serving as the source wiring or the drain wiring of the FET 316, the conductive layer 341 serving as the source wiring or the drain wiring of the FET 319, and the conductive layer 503 are electrically connected through the conductive particles 506.

Subsequently, a cross-sectional structure of a semiconductor device of the present invention having a different structure from the above one is described with reference to FIG. 6. More specifically, a cross-sectional structure of a semiconductor device having a different structure from the semiconductor device shown in FIG. 5 only in the structure of the layer 502 including the plurality of storage elements is described.

The layer 501 including the plurality of field-effect transistors has the FETs 316 to 319, and these FET structures are as mentioned above. Moreover, the layer 502 including the plurality of storage elements has the same structure as the layer 402 including the plurality of storage elements shown in FIG. 4B. Then, as well as the structure shown in FIG. 5, the substrate which has the layer 501 including the plurality of field-effect transistors and the layer 502 including the plurality of storage elements and the substrate 504 where the conductive layer 503 is provided are adhered to each other by resin 505 including the conductive particle 506. Then, the conductive layer 334 serving as the source wiring or the drain wiring of the FET 316, the conductive layer 341 serving as the source wiring or the drain wiring of the FET 319, and the conductive layer 503 are electrically connected through the conductive particle 506.

It is to be noted that, in some cases, data are written by an optical action using laser light to the layer 502 including the plurality of storage elements depending on the structure of the storage elements. In such a case, it is necessary to make the two substrates adhere to each other so that the layer 502 including the plurality of storage elements does not overlap the conductive layer 503 on the substrate 504.

Figure 5:
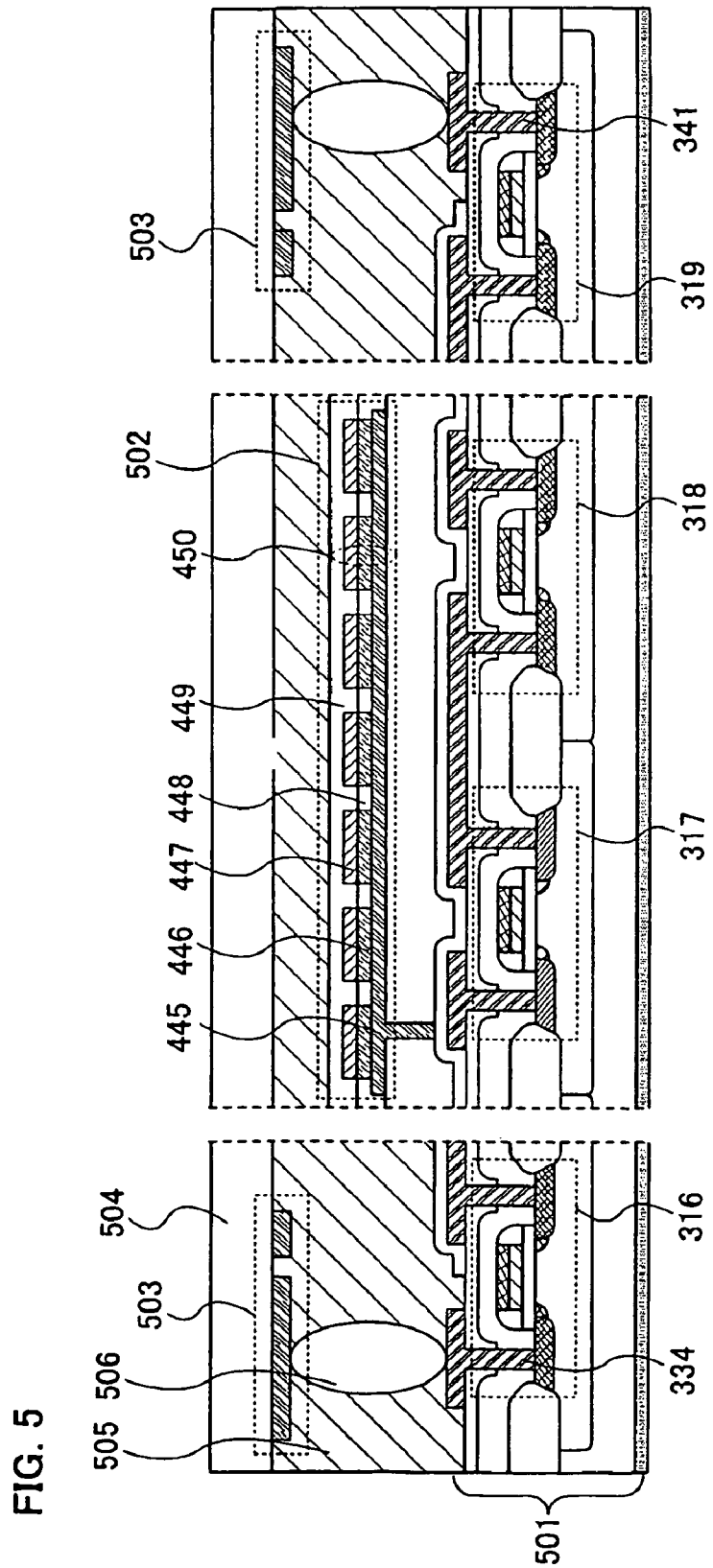
FIG. 5 describes a semiconductor device of the present invention.
Figure 6:
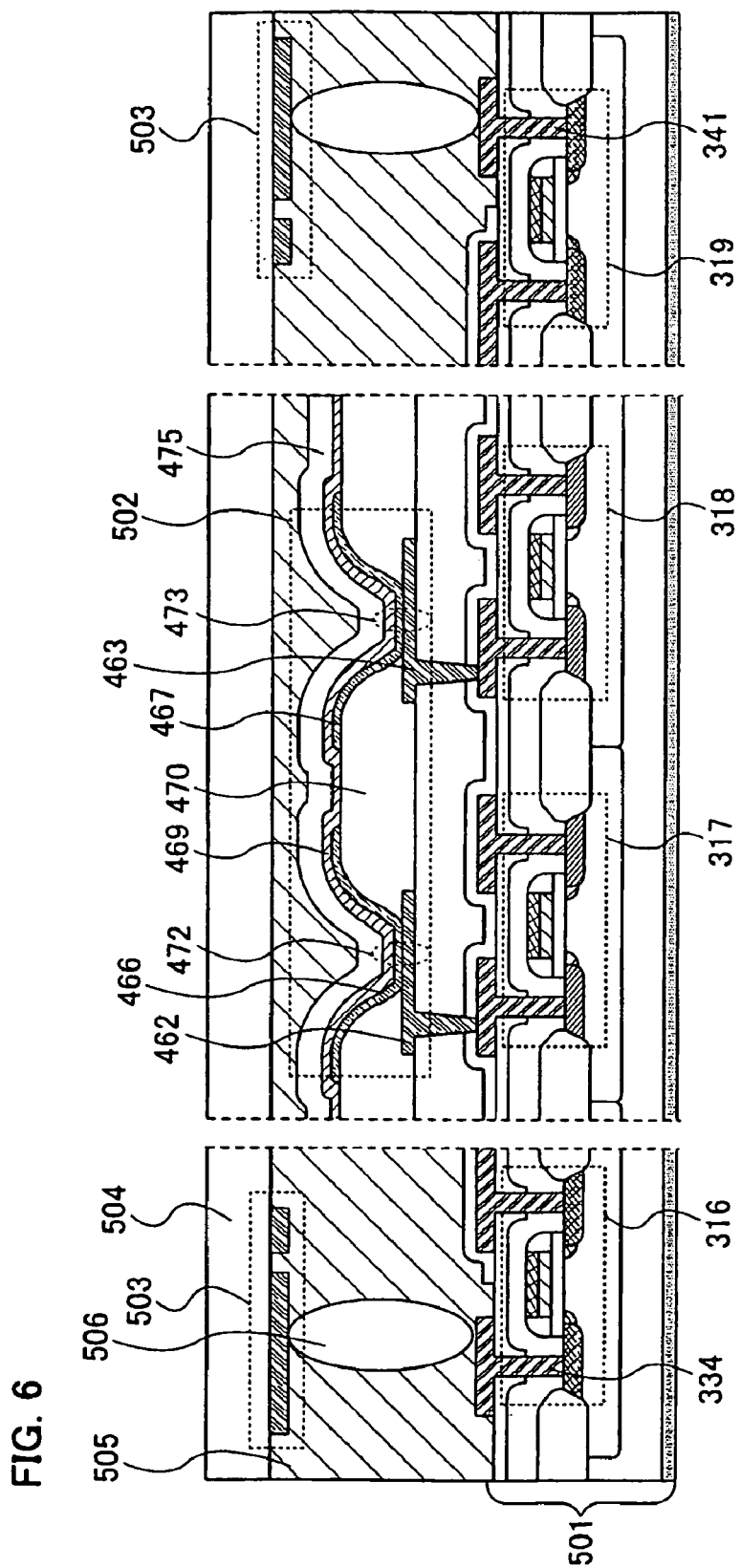
FIG. 6 describes a semiconductor device of the present invention.

In the structures shown in FIGS. 5 and 6, the conductive layer serving as the source wirings or the drain wirings of the FETs 316 and 319 is connected to the conductive layer 503 on the substrate 504 through the conductive particle 506; however, the present invention is not limited to this structure. When the conductive layer serving as the source wirings or the drain wirings of the FETs 316 and 319 is formed, the conductive layer which connects to the source region or the drain region and which exposes to the rear surface may be formed and connected to the conductive layer 503 over the substrate 504.

That is to say, as the conductive layer serving as the source wirings or the drain wirings of the FETs 316 to 319, a conductive layer which connects to the source regions or the drain regions of the FETs 316 to 319 through a first opening portion and which exposes to the rear surface through a second opening portion may be formed. The first opening portion is an opening portion provided in the insulating layers 332 and 333. The second opening portion is an opening portion provided in the insulating layer 301, the single-crystal semiconductor layer 302, and the insulating layers 332 and 333. Then, the substrate 504 may be provided on one surface side of the insulating layer 301 so that the conductive layer 503 over the substrate 504 may be electrically connected to the exposed conductive layer described above.

Embodiment Mode 3

Figure 7A:
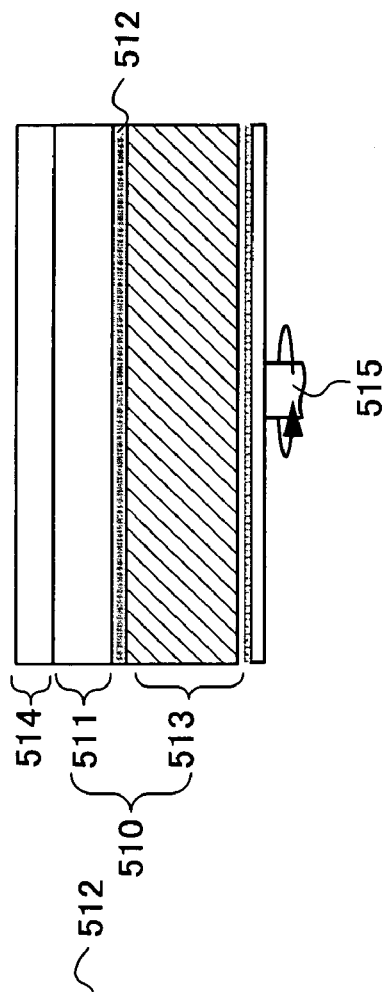
FIGS. 7A to 7D describe a method for manufacturing a semiconductor device in accordance with the present invention.

A method for manufacturing a semiconductor device according to the present invention will be described with reference to the drawings. In the present invention, an SOI (silicon on insulator) substrate where an insulating layer and a single-crystal semiconductor layer are stacked is used. As the SOI substrate, for example, a SIMOX (separation by implanted oxygen) substrate is given. A SIMOX substrate 510 is a substrate manufactured by forming an insulating layer and a single-crystal semiconductor layer over the insulating layer in such a way that oxygen is implanted in a part which is slightly deep from the surface of the single-crystal semiconductor layer and the single-crystal semiconductor layer is oxidized with the oxygen at high temperature. Specifically, the SIMOX substrate 510 is a substrate formed by a first single-crystal semiconductor layer 511, an insulating layer 512, and a second single-crystal semiconductor layer 513 are stacked (refer to FIG. 7A).

Figure 7B:
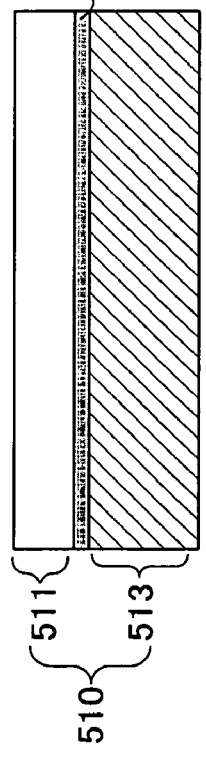
Figure 7C:
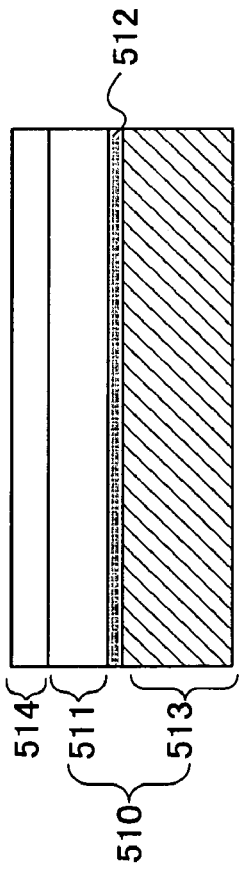
Figure 7D:
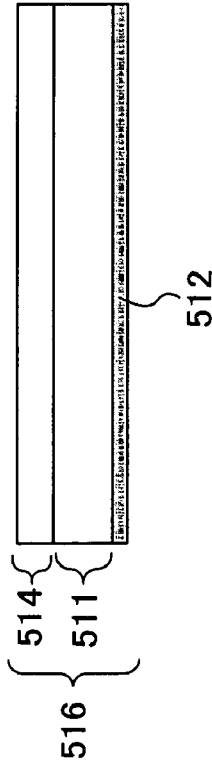

A method for manufacturing a semiconductor device according to the present invention using the SIMOX substrate 510 is described. First, a plurality of field-effect transistors are formed in each of which the first single-crystal semiconductor layer 511 on one surface of the SIMOX substrate 510 is used as an active layer. Subsequently, a layer 514 including a plurality of storage elements is formed over the first single-crystal semiconductor layer 511 (refer to FIG. 7B). Next, the second single-crystal semiconductor layer 513 on a surface opposite to the one surface of the SIMOX substrate 510 is etched away (refer to FIG. 7C). Then, a semiconductor device 516 is completed in which the insulating layer 512, the first single-crystal semiconductor layer 511, and the layer 514 including the plurality of storage elements are stacked in order (refer to FIG. 7D).

It is to be noted that the second single-crystal semiconductor layer 513 may be removed by using a grinding and polishing apparatus 515 such as a grind stone or by using etchant or by using both of a grinding and polishing apparatus 515 and an etchant in combination. It is preferable that the second single-crystal semiconductor layer 513 be ground and polished until the second single-crystal semiconductor layer 513 is thinned to a certain degree and then removed by the etchant until the insulating layer 512 is exposed. If wet etching is employed, the etchant may be, for example, a mixed solution in which fluorinated acid is diluted with water or ammonium fluoride, a mixed solution of fluorinated acid and nitric acid, a mixed solution of fluorinated acid, nitric acid, and acetic acid, a mixed solution of hydrogen peroxide and sulfuric acid, a mixed solution of hydrogen peroxide, ammonia water, or a mixed solution of hydrogen peroxide, hydrochloric acid. If dry etching is employed, the etchant may be, for example, gas including a halogen atom or molecule such as fluorine or gas including oxygen. It is preferable to use gas or liquid including halogen fluoride or an interhalogen compound. For example, chlorine trifluoride ($ClF_3$) is preferably used as the gas including halogen fluoride.

The layer 514 including the plurality of storage elements has a plurality of storage elements each having an organic compound layer sandwiched between a pair of conductive layers. This organic compound layer may be formed by a droplet discharging method typified by ink jet. By employing a droplet discharging method, high usage efficiency of a material can be obtained and a method for manufacturing a semiconductor device in which manufacturing steps are simplified can be provided. Further, a method for manufacturing a semiconductor device for short time and with low cost spent in the manufacturing can be provided.

The thickness of the second single-crystal semiconductor layer 513 included in the SIMOX substrate 510 ranges from several tens to several hundred micrometers while that of the first single-crystal semiconductor layer 511 is as small as 0.3 µm or less. Therefore, when the second single-crystal semiconductor layer 513 is removed after forming a plurality of field-effect transistors using the first single-crystal semiconductor layer 511, a small, thin, and lightweight semiconductor device can be provided. Further, because of its smallness, thinness, and lightweightness, a semiconductor device having high drop impact resistance can be obtained.

The semiconductor device of the present invention completed by the above manufacturing method is very thin and has flexibility. Therefore, after making the semiconductor device 516 of the present invention is attached to a card-like substrate 518 where the conductive layer 517 serving as the antenna is provided (refer to FIG. 8A), the semiconductor device 516 can be transformed (refer to FIG. 8B). The semiconductor device 516 of the present invention can be attached not only to a card-like substrate 518 but also to an object 520 having a curved surface or other irregular shapes (refer to FIG. 8C). In this way, since the semiconductor device 516 of the present invention is small, thin, and lightweight and also has flexibility, various applications are possible. Even when the semiconductor device 516 is attached to any object, the design quality of the object is not degraded.

Embodiment Mode 4

A structure of a storage circuit of a semiconductor device according to the present invention and operation of the storage circuit are described with reference to the drawings. The storage circuit of the present invention has a memory cell array 22 in which memory cells 21 are arranged in a matrix form, decoders 23 and 24, a selector 25, and a read/write circuit 26. The memory cell 21 has a storage element 30 (refer to FIG. 9A).

Figure 10A:
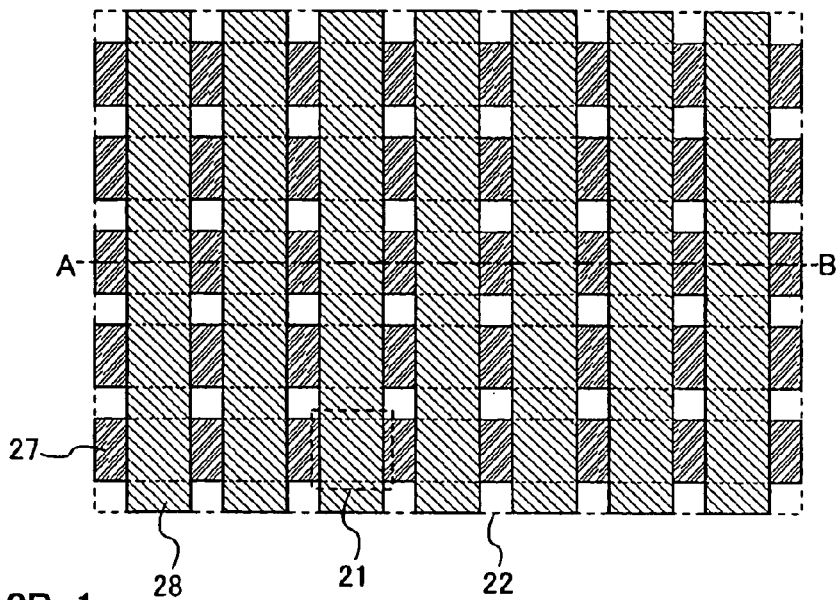
FIGS. 10A to 10C describe a semiconductor device of the present invention.
Figures 1, 10B:
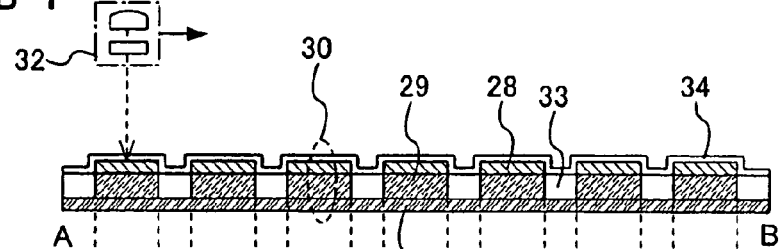
Figures 2, 10B:
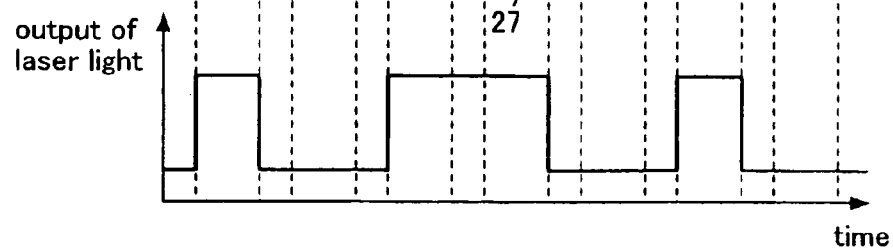

The storage element 30 has a first conductive layer 27 constituting a bit line Bx ($1 \leq x \leq m$), a second conductive layer 28 constituting a word line Wy ($1 \leq y \leq n$), and an organic compound layer 29 provided between the first conductive layer 27 and the second conductive layer 28 (refer to FIG. 10A). A multilayer body including the first conductive layer 27, the organic compound layer 29 (refer to FIG. 10B-1), and the second conductive layer 28 corresponds to the storage element 30. Between the adjacent organic compound layers 29, an insulating layer 33 is provided. Moreover, an insulating layer 34 is provided over the plurality of storage elements 30. The first conductive layer 27 constituting the bit line Bx extends in a first direction and the second conductive layer 28 constituting the word line Wy extends in a second direction perpendicular to the first direction. That is to say, the first conductive layer 27 and the second conductive layer 28 are arranged in a stripe form so that the first conductive layer 27 and the second conductive layer 28 intersect with each other.

As described later, data may be written in the storage element 30 by an optical action depending on the structure of the organic compound layer 29. In such a case, one or both of the first conductive layer 27 and the second conductive layer 28 need to have a light-transmitting property. The light-transmitting conductive layer is formed with a transparent conductive material such as indium tin oxide (ITO) or, even if the conductive material is not transparent, formed thinly enough to transmit the light.

Figure 9A:
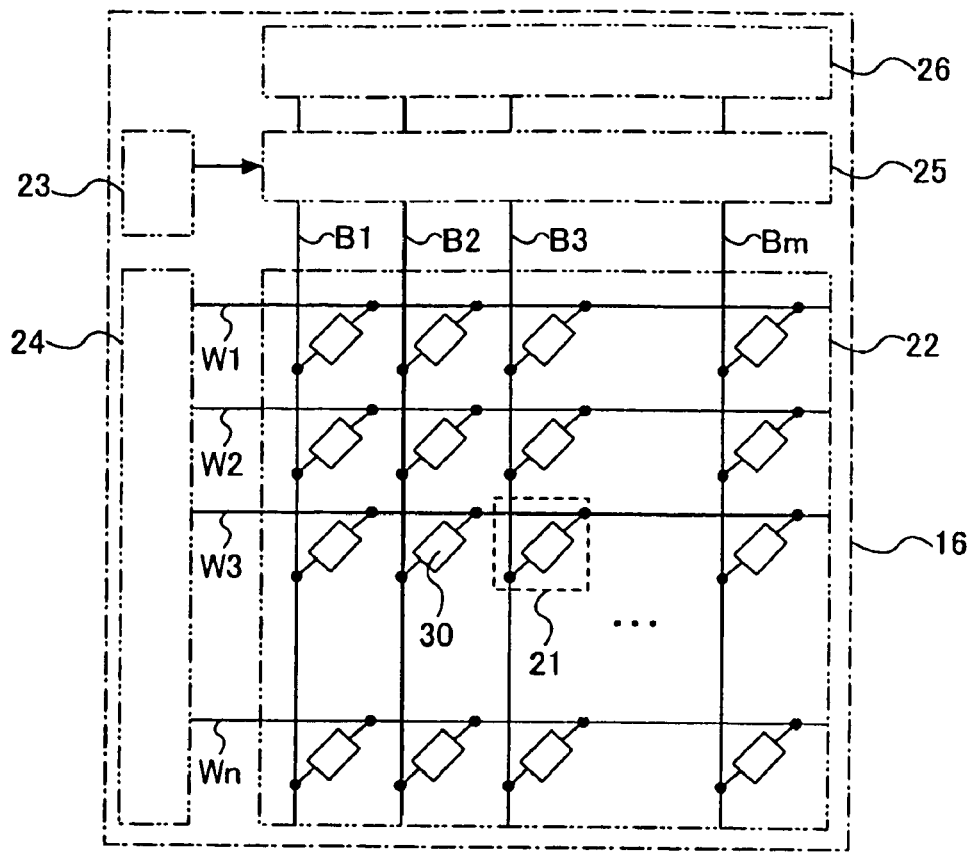
FIGS. 9A and 9B describe a semiconductor device of the present invention.
Figure 11:
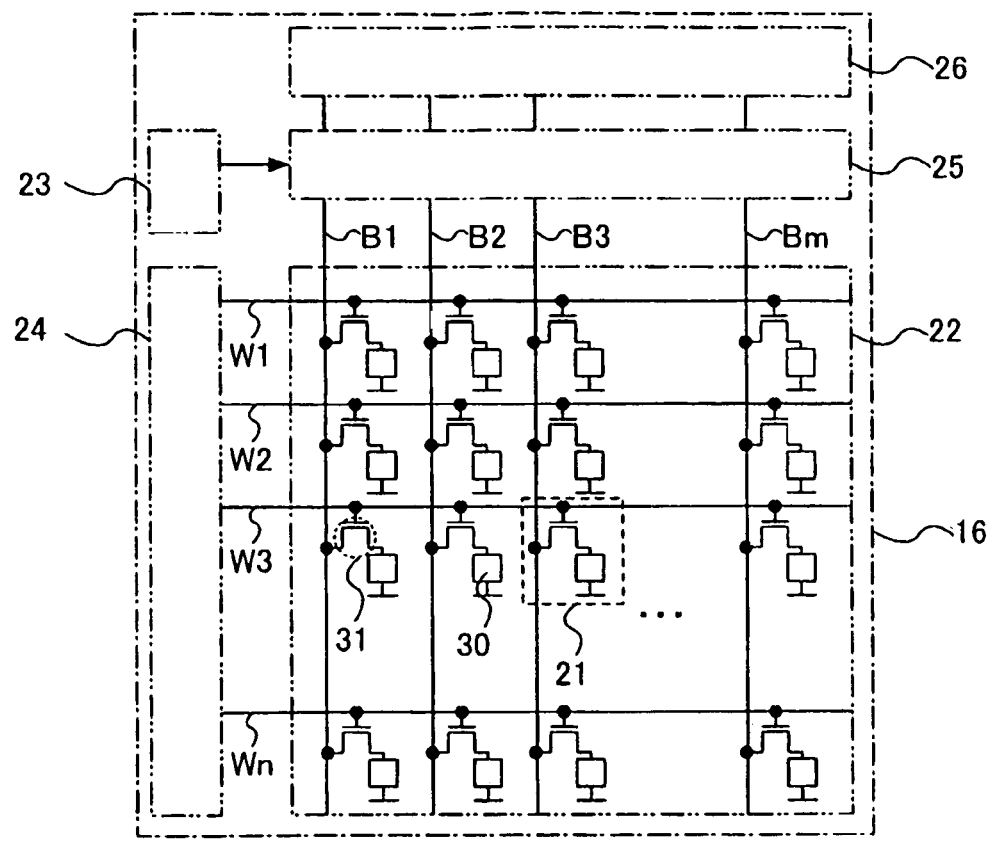
FIG. 11 describes a semiconductor device of the present invention.

Although an equivalent circuit diagram in FIG. 9A shows a passive matrix type, an active matrix type in which an field-effect transistor 31 is provided in the memory cell 21 may be employed (refer to FIG. 11). In this case, a gate electrode of the field-effect transistor 31 is connected to the word line Wy ($1 \leq y \leq n$), one of a source electrode and a drain electrode of the field-effect transistor 31 is connected to the bit line Bx ($1 \leq x \leq m$), and the other one of the source electrode and the drain electrode thereof is connected to one electrode of the storage element 30.

The organic compound layer 29 is formed with an organic compound material. For example, the following organic compound material having high a hole-transporting property can be used: an aromatic amine compound (having a bond of a benzene ring with nitrogen), phthalocyanine (abbreviated to $H_2Pc$), or a phthalocyanine compound such as copper phthalocyanine (abbreviated to CuPc) or vanadyl phthalocyanine (abbreviated to VOPc). The aromatic amine compound is, for example, 4,4'-bis[N-(1-naphthyl)-N-phenyl-amino]-biphenyl (abbreviated to α-NPD), N,N'-diphenyl-N,N'-bis(3-methylphenyl)-1,1'-biphenyl-4,4'-diamine (abbreviated to TPD), 4,4',4''-tris(N,N-diphenyl-amino)-triphenylamine (abbreviated to TDATA), 4,4',4''-tris[N-(3-methylphenyl)-N-phenyl-amino]-triphenylamine (abbreviated to MTDATA), or 4,4'-bis(N-(4-(N,N-di-m-tolylamino)phenyl)-N-phenylamino)biphenyl (abbreviated to DNTPD).

Besides, a material having a high electron-transporting property can be used as the organic compound material. For example, the following can be used: a metal complex having a quinoline skeleton or a benzoquinoline skeleton such as tris-(8-quinolinolato)aluminum (abbreviated to $Alq_3$), tris(4-methyl-8-quinolinolato)aluminum (abbreviated to $Almq_3$), bis(10-hydroxybenzo[h]-quinolinato)beryllium (abbreviated to $BeBq_2$), or bis(2-methyl-8-quinolinolato)-4-phenylphenolato-aluminum (abbreviated to BAlq). Besides, a metal complex having an oxazole or thiazole ligand such as bis[2-(2-hydroxyphenyl)benzoxazolate]zinc (abbreviated to $Zn(BOX)_2$) or bis[2-(2-hydroxyphenyl)benzothiazolate]zinc (abbreviated to $Zn(BTZ)_2$) can be used. In addition to the metal complex, 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-biphenylyl)-4-phenyl-5-(4-tert-butylphenyl)-1,2,4-triazole (abbreviated to TAZ), 3-(4-biphenyl)-4-(4-ethylphenyl)-5-(4-tert-butylphenyl)-1,2,4-triazole (abbreviated to p-EtTAZ), bathophenanthroline (abbreviated to BPhen), bathocuproin (abbreviated to BCP), or the like can also be used.

Furthermore, as the organic compound material, the following can be employed: 4-(dicyanomethylene)-2-methyl-6-[2-(1,1,7,7-tetramethyljulolidine-9-yl)ethenyl]-4H-pyran (abbreviated to DCJT), 4-(dicyanomethylene)-2-t-butyl-6-(1,1,7,7-tetramethyljulolidyl-9-enyl)-4H-pyran, periflanthene, 2,5-dicyano-1,4-bis(10-methoxy-1,1,7,7-tetramethyljulolidyl-9-enyl)benzene, N,N'-dimethylquinacridone (abbreviated to DMQd), coumarin 6, coumarin 545T, tris (8-quinolinolato)aluminum (abbreviated to $Alq_3$), 9,9'-bianthryl, 9,10-diphenylanthracene (abbreviated to DPA), 9,10-bis(2-naphthyl)anthracene (abbreviated to DNA), 2,5,8,11-tetra-t-butylperylene (abbreviated to TBP), or the like. As a host material in the case of forming a layer in which the light-emitting material is diffused, the following can be used; an anthracene derivative such as 9,10-di(2-naphtyl)-2-tert-butylanthracene (abbreviated to t-BuDNA), a carbazole derivative such as 4,4'-bis(N-carbazolyl)biphenyl (abbreviated to CBP), a metal complex such as bis[2-(2-hydroxyphenyl)pyridinato]zinc (abbreviated to $Znpp_2$), or bis[2-(2'-hydroxyphenyl)benzoxazolate]zinc (abbreviated to ZnBOX), or the like. Moreover, tris(8-quinolinolato)aluminum (abbreviated to $Alq_3$), 9,10-bis(2-naphtyl)anthracene (abbreviated to DNA), bis(2-methyl-8-quinolinolato)(4-phenylphenolato) aluminum (abbreviated to BAlq), or the like can be used.

In addition, the organic compound layer 29 can be formed with a material whose electric resistance changes by an optical action. For example, a conjugate polymer doped with a compound which generates acid by absorbing light (a photoacid generator) can be used. As the conjugate polymer, polyacetylenes, polyphenylenevinylenes, polythiophenes, polyanilines, polyphenylene ethynylenes, or the like can be used. As the photoacid generator, aryl sulfonium salt, aryl iodonium salt, o-nitrobenzyl tosylate, aryl sulfonic acid p-nitrobenzylester, sulfonyl acetophenones, or the like can be used.

Next, an operation when data are written in a storage circuit having the above structure is described. The data are written by an optical action or an electric action.

First, a case is described in which data are written by an electric action (refer to FIG. 9A). In this case, first, one memory cell 21 is selected by the decoders 23 and 24 and the selector 25. After that, data are written in the memory cell 21 by the read/write circuit 26. More specifically, a predetermined amount of voltage is applied to the storage element 30 in the selected memory cell 21 to flow a large amount of current, thereby shorting between a pair of conductive layers of the storage element 30. The storage element 30 of which the pair of the conductive layers are shorted has drastically a lower resistance value than the other storage elements 30. In this way, the data are written in the storage element 30 utilizing the change in the resistance value of the storage element 30 by applying an electric action. For example, if data of the storage element 30 to which the electric action has not been applied are assumed to be "0", data of "1" are written by applying voltage to the selected storage element 30 to flow a large amount of current for shorting the pair of the conductive layers of the storage element 30.

The present invention is not limited to the mode in which data are written by shorting the storage element 30 in such a way that a predetermined amount of voltage is applied to the storage element 30. The data may be written in such a way that a predetermined amount of voltage is applied to the storage element 30 by adjusting an element structure of the storage element 30 or the amount of applied voltage to insulate (making highly resistant) the organic compound layer 29 between the pair of conductive layers. In this case, the storage element 30 including the insulated organic compound layer 29 has a much higher resistance value than the other storage elements 30. In this way, the data are written utilizing the change in the resistance value of the storage element 30 by applying an electric action. For example, if data of the storage element 30 to which the electric action has not been applied are assumed to be "0", data of "1" are written by applying voltage to the selected storage element 30 to insulate the organic compound layer 29 between the pair of conductive layers. As described above, there is the case of decreasing the resistance of the storage element 30 by shorting the pair of the conductive layers of the storage element 30 and the case of increasing the resistance of the organic compound layer 29 between the pair of the conductive layers of the storage element 30 by applying a voltage to the organic compound layer 29. In the invention, either case may be adopted.

Next, a case is described in which data are written by an optical action with reference to FIGS. 10B-1, 10B-2 and 10C. In this case, the data are written by irradiating the organic compound layer 29 with laser light using a laser irradiation apparatus 32 from the light-transmitting conductive layer side (here the second conductive layer 28). More specifically, the organic compound layer 29 is broken by irradiating the organic compound layer 29 in the selected storage element 30 with laser light. The broken organic compound layer 29 is insulated, thereby having a much higher resistance value than the other storage elements 30. In this way, data are written by utilizing the change in the electric resistance of the storage element 30 by laser irradiation. For example, if data of the storage element 30 to which the laser irradiation has not been conducted are assumed to be "0", data of "1" are written in such a way that the electric resistance is increased by irradiating the storage element 30 with laser light to break the organic compound layer 29 in the storage element 30.

The present invention is not limited to the mode in which the data are written by insulating the organic compound layer 29 in such a way that the storage element 30 is irradiated with the laser light. In the present invention, the data may be written in such a way that the storage element 30 is irradiated with laser light by adjusting an element structure of the storage element 30 or the intensity of the laser light to electrically break the organic compound layer 29 between the pair of conductive layers, thereby shortening the pair of conductive layers. In this case, the storage element 30 in which the pair of conductive layers is shortened has a much lower resistance value than the other storage elements 30. In this way, the data may be written utilizing the change in the resistance value of the storage element 30 by applying the optical action.

When the organic compound layer 29 formed with a conjugate polymer doped with a compound generating acid by absorbing light (photoacid generator) is irradiated with laser light, the irradiated portion has high conductivity while the non-irradiated portion does not have conductivity. In this case, the data are also written utilizing the change in the resistance value of the storage element 30 by irradiating the selected organic compound layer 29 with the laser light. For example, if data of the storage element 30 to which the laser irradiation has not been conducted are assumed to be "0", data of "1" are written by irradiating the selected storage element 30 with laser light to increase the conductivity.

Figure 9B:
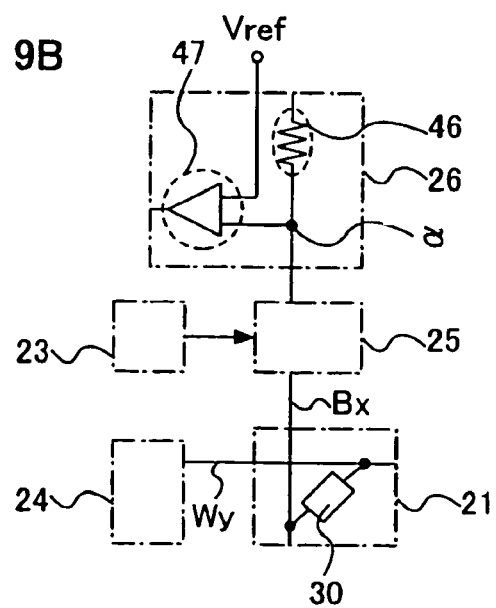

Subsequently, an operation when the data are read is described with reference to FIGS. 9A and 9B. Here, the read/write circuit 26 includes a resistance element 46 and a sense amplifier 47. However, the structure of the read/write circuit 26 is not limited to the above structure, and the read/write circuit 26 may have any structure.

The data are read by applying voltage between the first conductive layer 27 and the second conductive layer 28 to read the resistance value of the storage element 30. For example, in the case of writing the data by applying an electric action as described above, the resistance value of the storage element 30 with the electric action not applied thereto is different from that of the storage element 30 with the electric action applied thereto. The data are read by electrically reading such a difference in the resistance value.

The same thing applies to the case in which data are written by irradiating the organic compound layer 29 with laser light. The data are read by electrically reading the difference in the resistance value between the storage element 30 with an optical action not applied thereto and the storage element 30 with an optical action applied thereto.

The same thing also applies to the case in which the organic compound layer 29 is formed with a conjugate polymer doped with a compound generating acid by absorbing light (photoacid generator). Data are read by electrically reading a difference in the resistance values between the storage element 30 with an optical action not applied thereto and the storage element 30 with an optical action applied thereto.

For example, in the case of reading the data from the memory cell 21 disposed in an x-th column and a y-th row from among the plurality of memory cells 21 in the memory cell array 22, first, the bit line Bx in the x-th column and the word line Wy in the y-th row are selected by the decoders 23 and 24 and the selector 25. Then, the resistor element 46 and the storage element 30 in the memory cell 21 are in such a state that they are serially connected. Here, if the storage element 30 is assumed to be a resistor element and voltage is applied to the opposite ends of the two serially-connected resistance elements, the electric potential of a node a becomes a resistance-divided electric potential in accordance with the resistance value of the storage element 30. The electric potential of the node α is supplied to the sense amplifier 47. In the sense amplifier 47, which of the information "0" and "1" is contained is judged. After that, a signal containing the information "0" or "1" judged by the sense amplifier 47 is supplied to the outside.

According to the above method, the information in the storage element 30 is read by its voltage value by using the difference in the resistance value and the resistance division. However, a method in which the current values are compared may be employed. This is, for example, a method using the difference in the current values due to the difference in the resistance values between the storage element 30 to which the electric action has been applied and the storage element 30 to which the electric action has not been applied. In this way, the data may be read by electrically reading the difference in the current value.

Figure 10C:
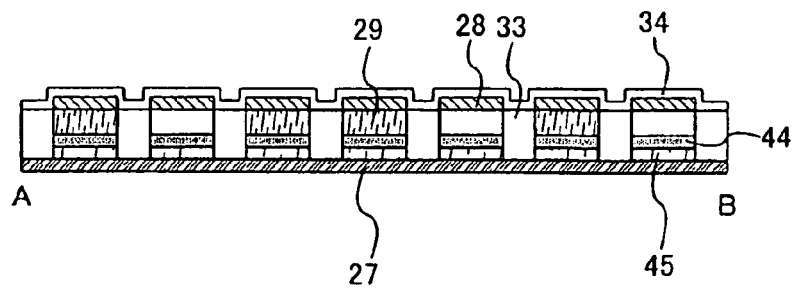

As a different structure from the above one, an element having a rectifying property may be provided between the first conductive layer 27 and the organic compound layer 29 (refer to FIG. 10C). The element having a rectifying property is a transistor in which a gate electrode and a drain electrode are connected or a diode. Here, a case is shown in which a PN junction diode including semiconductor layers 44 and 45 is provided. One of the semiconductor layers 44 and 45 is an N-type semiconductor and the other is a P-type semiconductor. In this way, the provision of the rectifying diode decreases the error and increases the accuracy of reading because the current flows only in one direction. In the case of providing a diode, not only a PN junction diode but also another type of diode such as a PIN junction diode or an avalanche diode may be used.

Embodiment Mode 5

Figure 12:
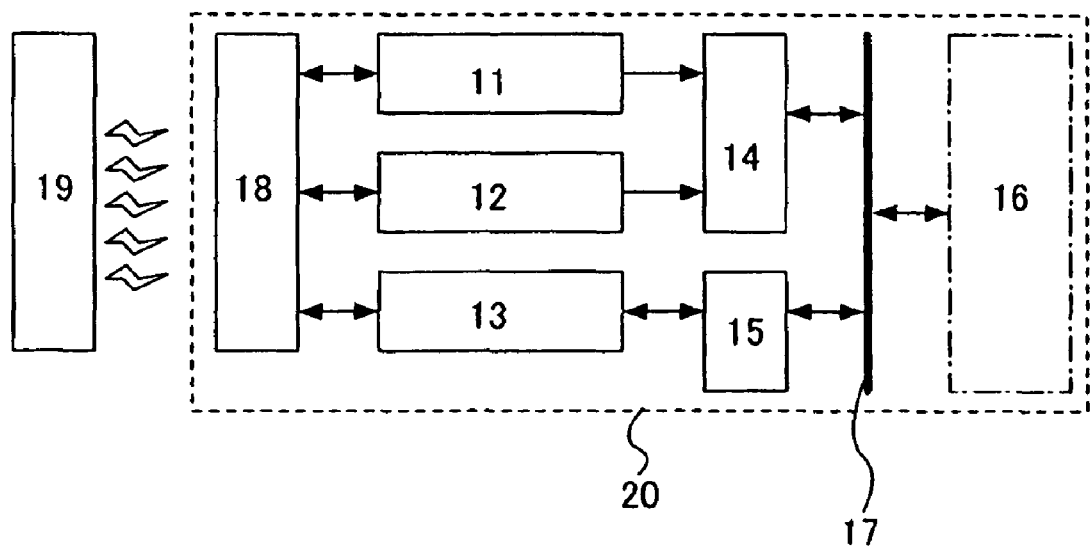
FIG. 12 describes a semiconductor device of the present invention.

A structure of a semiconductor device according to the present invention which sends and receives data in a non-contact way is described with reference to the drawings. A semiconductor device 20 according to the present invention has a function to exchange data in a non-contact way and comprises a power source circuit 11, a clock generation circuit 12, a data modulation/demodulation circuit 13, a control circuit 14 for controlling another circuit, an interface circuit 15, a storage circuit 16, a data bus 17, and an antenna (antenna coil) 18 (refer to FIG. 12).

The power source circuit 11 is a circuit for generating electric current and electric voltage which will be supplied to each circuit inside the semiconductor device 20 based on an alternating signal inputted from the antenna 18. The clock generation circuit 12 is a circuit for generating various clock signals which will be supplied to each circuit inside the semiconductor device 20 based on the alternating signal inputted from the antenna 18. The data modulation/demodulation circuit 13 has a function to modulate/demodulate data which will be sent to and received from a reader/writer 19. The control circuit 14 has a function to control the storage circuit 16. The antenna 18 has a function to send/receive an electromagnetic field or an electric wave. The reader/writer 19 has a function to communicate with the semiconductor device, control the semiconductor device, and process the data sent to or received from the semiconductor device. It is to be noted that the semiconductor device is not limited to the above structure. For example, the semiconductor device may have an additional element such as a limiter circuit of a power source voltage or hardware only for processing codes.

The storage circuit 16 has a storage element having an organic compound layer sandwiched between a pair of conductive layers. The storage circuit 16 may have only a storage element having an organic compound layer sandwiched between a pair of conductive layers or may also have a storage circuit having another structure. The storage circuit having another structure corresponds to, for example, one or more selected from a DRAM (Dynamic Random Access Memory), an SRAM (Static Random Access Memory), a FeRAM (Ferroelectric Random Access. Memory), a mask ROM (Read Only Memory), a PROM (Programmable Read Only Memory), an EPROM (Electrically Programmable Read Only Memory), an EEPROM (Electrically Erasable and Programmable Read Only Memory), and a flash memory.

Embodiment 1

This embodiment describes a result of an experiment for researching a current-voltage characteristic of a storage element manufactured over a substrate when data are written in the storage element by an electric action. The storage element is an element formed by stacking a first conductive layer, a first organic compound layer, a second organic compound layer, and a second conductive layer in order over a substrate. The first conductive layer is formed with a compound of silicon oxide and indium tin oxide (this compound is sometimes abbreviated to NITO), the first organic compound layer is formed with 4,4'-bis[N-(3-methylphenyl)-N-phenyl-amino]-biphenyl (sometimes abbreviated to TPD), the second organic compound layer is formed with 4,4'-bis[N-(1-naphthyl)-N-phenyl-amino]-biphenyl (sometimes abbreviated to α-NPD), and the second conductive layer is formed with aluminum. The first organic compound layer is formed in 10 nm thick, and the second compound layer is formed in 50 nm thick.

Figure 13:
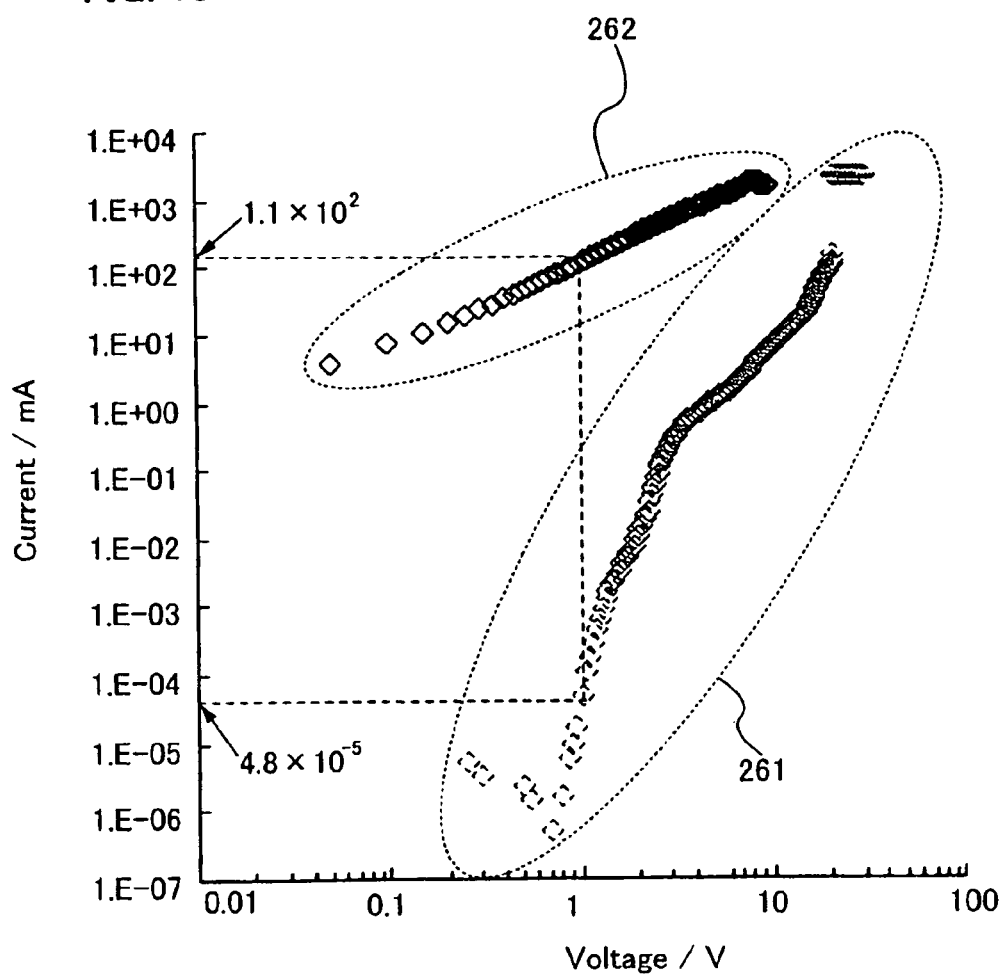
FIG. 13 shows a current-voltage characteristic of a storage element.

First, a measurement result of a current-voltage characteristic of the storage element before and after writing data by an electric action is described with reference to FIG. 13. In FIG. 13, the horizontal axis shows a voltage value, the vertical axis shows a current value, a plot 261 shows a current-voltage characteristic of the storage element before writing data by an electric action, and a plot 262 shows a current-voltage characteristic of the storage element after writing the data by an electric action. As shown in FIG. 13, the current-voltage characteristic of the storage element drastically changes before and after writing the data. For example, at an applied voltage of 1 V, the current value before writing the data is $4.8 \times 10^{-5}$ mA while the current value after writing the data is $1.1 \times 10^2$ mA. Before and after writing the data, the current value changes by 7 digits ($10^7$ times). As thus shown, the resistance value of the storage element changes before and after writing the data, and such a storage element can serve as a storage circuit by reading this change of the resistance value of the storage element from its voltage or current value.

In the case of using the storage element as above for the storage circuit, a predetermined amount of voltage (of such a degree that the shorting does not occur) is applied to the storage element every time the data are read, and the resistance value is read. Therefore, the current-voltage characteristic of the above storage element needs to stay unchanged even after reading the data repeatedly, that is, applying a predetermined amount of voltage repeatedly. Next, a measurement result of a current-voltage characteristic of a storage element after reading the data is described with reference to FIG. 14. In this experiment, the current-voltage characteristic of the storage element is measured every time the data are read. The current-voltage characteristic of the storage element is measured five times in total because the data are read five times in total. Moreover, the measurement of the current-voltage characteristic is conducted to two storage elements, in one of which the resistance value has been changed by writing the data by an electric action and in the other of which the resistance has not been changed.

Figure 14:
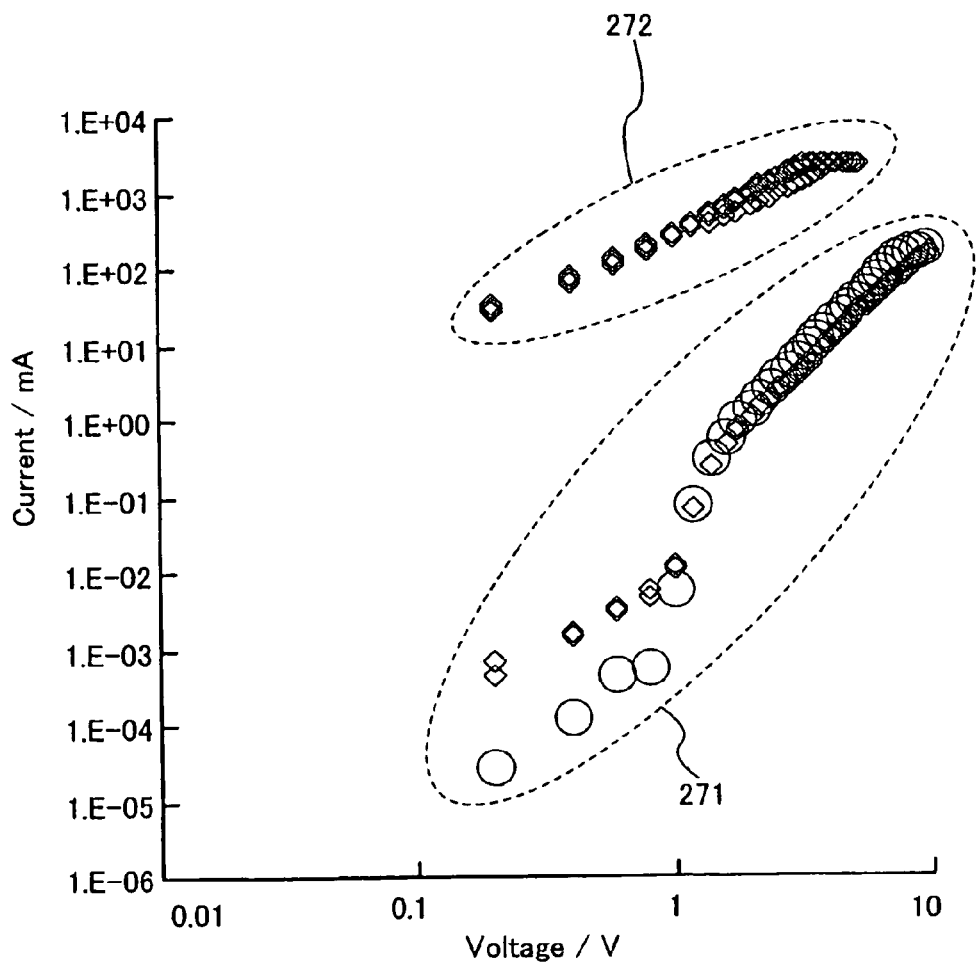
FIG. 14 shows a current-voltage characteristic of a storage element.

In FIG. 14, the horizontal axis shows a voltage value, the vertical axis shows a current value, a plot 272 shows a current-voltage characteristic of the storage element in which the resistance value has been changed by writing data by an electric action, and a plot 271 shows a current-voltage characteristic of the storage element in which the resistance value has not been changed. As can be seen from the plot 271, the current-voltage characteristic of the storage element in which the resistance value has not been changed exhibits favorable repeatability particularly when the voltage is 1 V or more. As can be seen from the plot 272 similarly, the current-voltage characteristic of the storage element in which the resistance value has been changed also exhibits favorable repeatability particularly when the voltage is 1 V or more. From the above results, the current-voltage characteristic does not drastically change even after reading the data plural times and the repeatability is favorable. The above storage element can be used as the storage circuit.

Embodiment 2

In this embodiment, a laser irradiation apparatus used when data are written in a storage circuit by an optical action is described with reference to the drawings.

Figure 15:
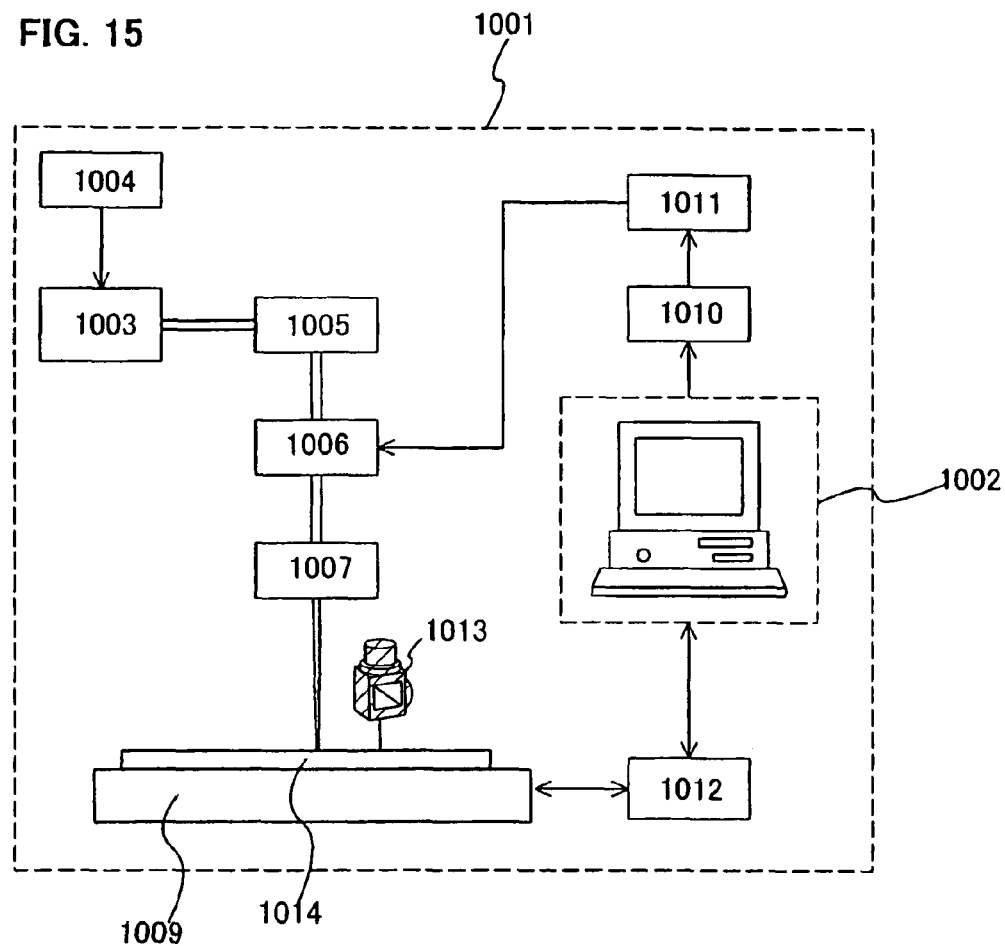
FIG. 15 describes a laser irradiation apparatus.

A laser irradiation apparatus 1001 includes a computer 1002 for executing various controls in delivering laser light, a laser oscillator 1003 emitting the laser light, a power source 1004, an optical system 1005 for attenuating the laser light, an acousto-optic modulator 1006 for modulating the intensity of the laser light, an optical system 1007 including a lens for reducing the cross section of the laser light, a mirror for changing the optical path, and the like, a moving mechanism 1009 having an X-axis stage and a Y-axis stage, a D/A converter 1010 for converting control data outputted from the computer 1002, a driver 1011 for controlling the acousto-optic modulator 1006 in accordance with an analog voltage outputted from the D/A converter, a driver 1012 for outputting a signal to drive the moving mechanism 1009, and an autofocusing mechanism 1013 for focusing the laser light onto an irradiation object (refer to FIG. 15). As the laser oscillator 1003, a laser oscillator capable of emitting ultraviolet light, visible light, or infrared light can be used. Specifically, an excimer laser oscillator of KrF, ArF, XeCl, Xe, or the like, a gas laser oscillator of He, He—Cd, Ar, He—Ne, HF, or the like, a solid-state laser oscillator using a crystal of YAG, $GdVO_4$, $YVO_4$, YLF, $YAlO_3$, or the like each of which is doped with Cr, Nd, Er, Ho, Ce, Co, Ti, or Tm, or a semiconductor laser oscillator of GaN, GaAs, GaAlAs, InGaAsP, or the like can be used.

Next, an operation of the laser irradiation apparatus 1001 having the above structure is described. First, when a substrate 1014 is mounted over the moving mechanism 1009, the computer 1002 detects the position of a storage element to be irradiated with the laser light. Subsequently, the computer 1002 produces motion data for moving the moving mechanism 1009 based on the detected positional data. Then, after the optical system 1005 attenuates the laser light emitted from the laser oscillator 1003, the computer 1002 controls the amount of the laser light to be emitted from the acousto-optic modulator 1006 so as to be the predetermined amount through the driver 1011. Meanwhile, the laser light emitted from the acousto-optic modulator 1006 passes through the optical system 1007 so that the optical path and the beam spot shape of the laser light are changed. After condensing the laser beam by the lens, the laser light is delivered to the substrate 1014. Here, the moving mechanism 1009 is controlled so as to move in the X-direction and the Y-direction based on the motion data produced by the computer 1002. As a result, a predetermined position is irradiated with the laser light, and the energy density of the laser light is converted into heat energy. Thus, the storage element provided over the substrate 1014 is selectively irradiated with the laser light. Although the laser irradiation is conducted by moving the moving mechanism 1009 in the above description, the laser light may be moved in the X-direction and the Y-direction by adjusting the optical system 1007.

According to the present invention in which the data are written by irradiating with the laser light using the laser irradiation apparatus as above, the data can be written easily. Therefore, a large amount of data can be written in a short time.

Embodiment 3

Figure 16A:
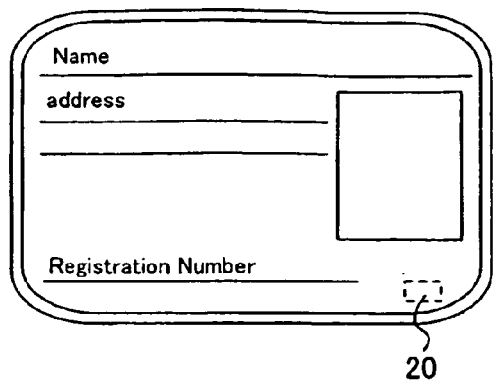
FIGS. 16A to 16E describe usage patterns of a semiconductor device of the present invention.
Figure 16B:
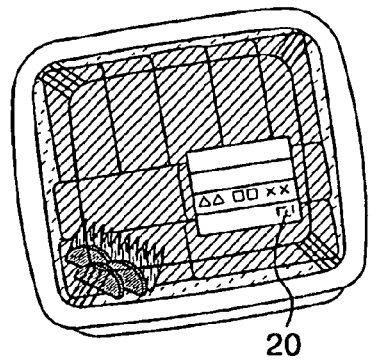
Figure 16C:
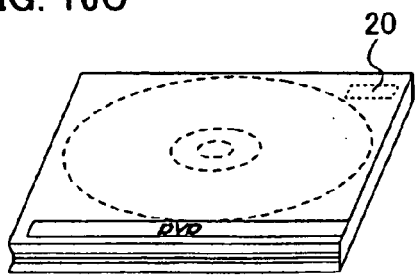
Figure 16D:
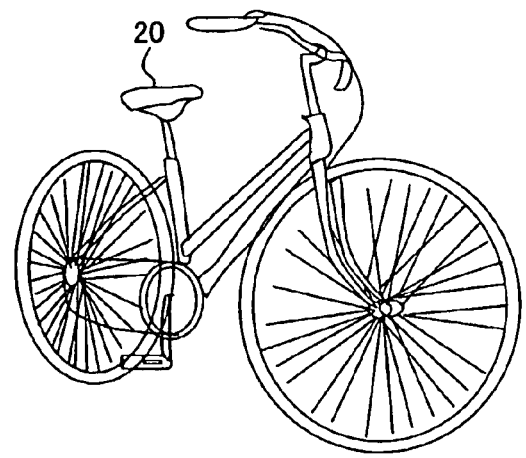
Figure 16E:
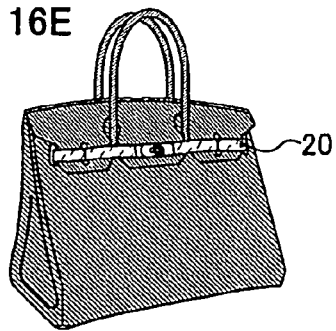

The semiconductor device of the present invention can be applied over a wide range and specific examples of these applications are described hereinafter. The semiconductor device 20 of the present invention can be applied to, for example, a banknote, a coin, documents of value, unregistered bonds, identification certificates (driver's license, certificate of residence, and the like, refer to FIG. 16A), pack cases (a pack paper, a bottle, and the like, refer to FIG. 16B), recording media (DVD software, a video tape, and the like, refer to FIG. 16C), vehicles (a bicycle and the like, refer to FIG. 16D), personal belongings (a bag, glasses, and the like (refer to FIG. 16E), foods, clothes, general merchandise, electronic appliances, and the like. The electronic appliances include a liquid crystal display device, an EL display device, a television device (also referred to as simply a TV, a TV receiving machine, or a television receiving machine), a mobile phone, and the like.

The semiconductor device 20 of the present invention is fixed to an object by mounting the device onto a print substrate, pasting the device to the surface, or embedding the device inside the object. For example, if the object is a book, the device is fixed to the book by embedding the device inside the paper, and if the object is a package made of an organic resin, the device is fixed to the package by embedding the device inside the organic resin. Since the semiconductor device 20 of the present invention is small, thin, and lightweight, the design quality is not degraded even after the device is fixed to an object. By providing the semiconductor device 20 of the present invention to a banknote, a coin, documents of value, unregistered bonds, identification certificates, and the like, an identification function can be provided, thereby preventing the forgery. Moreover, when the semiconductor device 20 of the present invention is provided in pack cases, recording media, personal belongings, foods, clothes, general merchandise, electronic appliances, and the like, a system such as an inspection system becomes more efficient.

Figure 17:
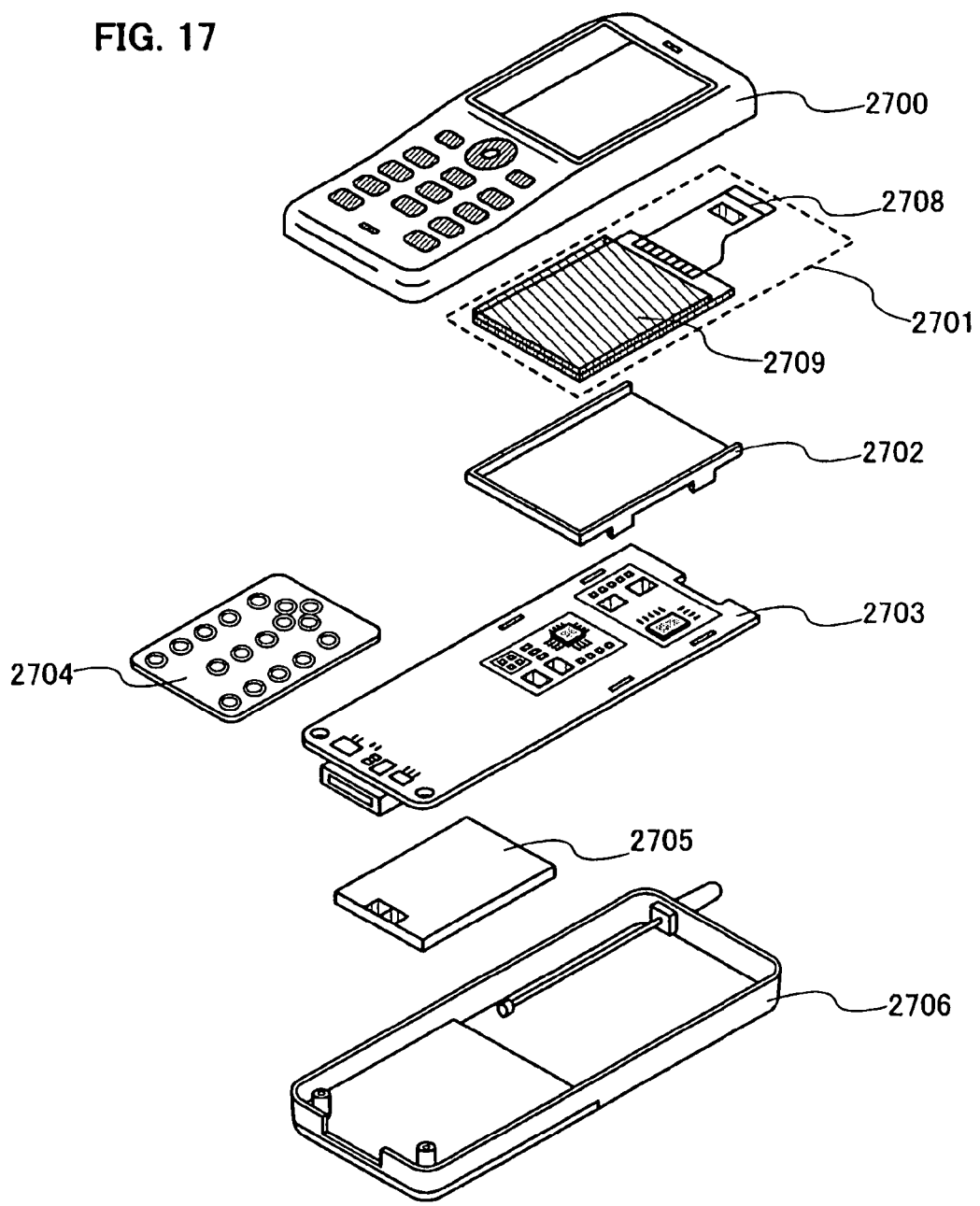
FIG. 17 describes an electronic appliance using a semiconductor device of the present invention.

Next, a mode of the electronic appliance where the semiconductor device of the present invention is mounted is described with reference to the drawing. The electronic appliance shown here is a mobile phone including cases 2700 and 2706, a panel 2701, a housing 2702, a print wiring substrate 2703, operation buttons 2704, a battery 2705, and the like (refer to FIG. 17). The panel 2701 is detachably incorporated in the housing 2702. The housing 2702 is fitted into the print wiring substrate 2703. The shape and dimension of the housing 2702 are appropriately changed in accordance with the electronic appliance where the panel 2701 is to be incorporated. Over the print wiring substrate 2703, a plurality of packaged semiconductor devices are mounted and the semiconductor device of the present invention can be used as one of the plurality of packaged semiconductor devices. The plurality of semiconductor devices mounted onto the print wiring substrate 2703 has any one of functions of a controller, a central processing unit (CPU, Central Processing Unit), a memory, a power source circuit, an audio processing circuit, a sending/receiving circuit, and the like.

The panel 2701 is integrated with the print wiring substrate 2703 through a connection film 2708. The above panel 2701, the housing 2702, and the print wiring substrate 2703 are placed in the cases 2700 and 2706 together with the operation buttons 2704 and the battery 2705. A pixel region 2709 in the panel 2701 is provided so as to be observed through an opening window provided in the case 2700.

As above, the semiconductor device of the present invention is small, thin, and lightweight, whereby the limited space in the cases 2700 and 2706 of the electric appliance can be effectively used.

Since the semiconductor device of the present invention has a field-effect transistor using a single-crystal semiconductor layer as a channel portion, the electronic appliance using the semiconductor device capable of high-speed operation can be provided. Moreover, since the variation in the characteristics of the field-effect transistors is little, the electronic appliance using the semiconductor device with high reliability can be provided.

Moreover, since the semiconductor device of the present invention has a structure in which a layer including a plurality of storage elements is stacked over a layer including a plurality of field-effect transistors each using a single-crystal semiconductor layer as a channel portion, an electronic appliance using a small semiconductor device can be provided.

In addition, since the semiconductor device of the present invention has a storage element having a simple structure in which an organic compound layer is sandwiched between a pair of conductive layers, an electronic appliance using an inexpensive semiconductor device can be provided. Further, since high integration is easy with the semiconductor device of the present invention, an electronic appliance using the semiconductor device having a high-capacity storage circuit can be provided.

In addition, a storage circuit in the semiconductor device of the present invention is nonvolatile and additionally recordable, and the data are written in the storage circuit by an optical action or an electric action. With this characteristic, the forgery due to the rewriting can be prevented and new data can be additionally written. Therefore, an electronic appliance using a sophisticated and high-value-added semiconductor device can be provided.

A method for manufacturing a semiconductor device according to the present invention employs a substrate where a first single-crystal semiconductor layer, an insulating layer, and a second single-crystal semiconductor layer are stacked, and comprises the steps of forming a plurality of transistors each of which uses the first single-crystal semiconductor layer as a channel portion and etching away the second single-crystal semiconductor layer. With this characteristic, an electronic appliance using a small, thin, and lightweight semiconductor device can be provided.

The cases 2700 and 2706 are shown as an example of an exterior shape of the mobile phone. The electronic appliance of this embodiment can be changed variously in accordance with the function or the intended purpose thereof. Therefore, examples of other modes of the electronic appliance are hereinafter described with reference to FIGS. 18A to 18C.

Figure 18A:
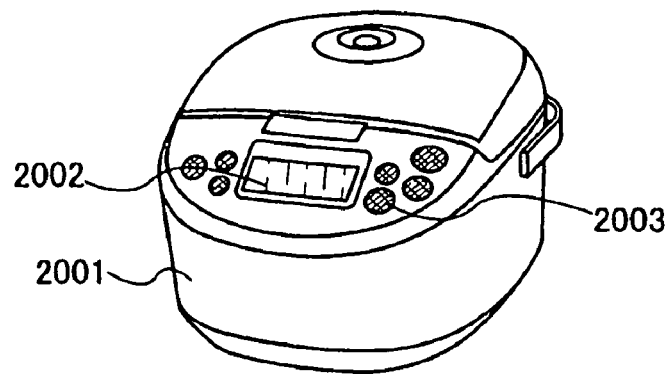
FIGS. 18A to 18C describe electronic appliances using a semiconductor device of the present invention.

FIG. 18A shows a rice cooker including a case 2001, a display portion 2002, operation buttons 2003, and the like. By providing the semiconductor device of the present invention in the rice cooker, various data can be stored in the rice cooker and the data can be displayed in the display portion 2002. For example, when recipes for cooking white rice, porridge, rice cooked with mountain vegetables, and the like (for example, the amount of water, the amount of rice, and the like) are stored in advance, a user can easily search for the information that the user wants to know by operating the operation buttons 2003. Moreover, for example, the user can additionally record the data of softness of the rice or the like in accordance with the user's taste so that the rice cooker operates based on the written information.

Figure 18B:
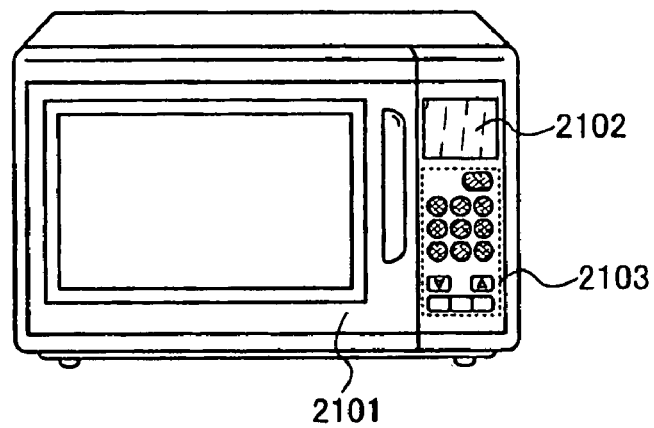

FIG. 18B shows a kitchen microwave including a case 2101, a display portion 2102, operation buttons 2103, and the like. By providing the semiconductor device of the present invention in the kitchen microwave, various data can be stored in the kitchen microwave and the data can be displayed in the display portion 2102. For example, recipes of various dishes, heat/thaw time of the materials, and the like are stored in advance and a user can easily search for the information that the user wants to know by operating the operation buttons 2103. Furthermore, a recipe of an original dish of the user and the like that have not been stored as data can be additionally recorded.

Figure 18C:
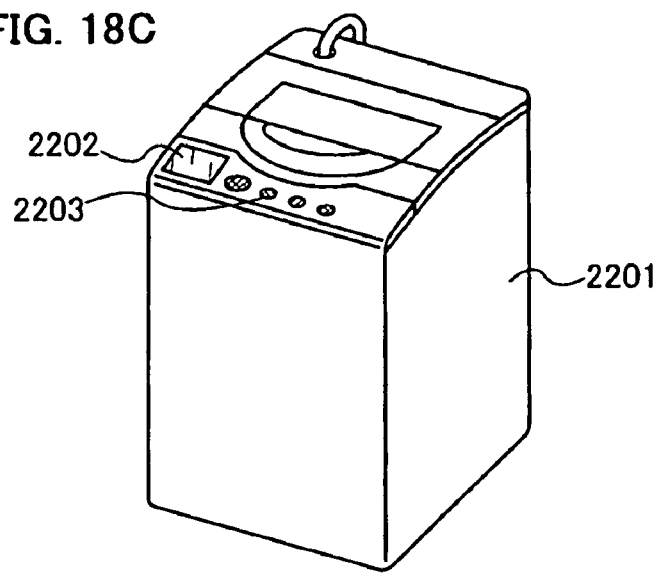

FIG. 18C shows a laundry machine including a case 2201, a display portion 2202, operation buttons 2203, and the like. By providing the semiconductor device of the present invention in the laundry machine, various data can be stored in the laundry machine and the data can be displayed in the display portion 2202. For example, a washing method, the amounts of water and detergents to the amount of clothes, and the like are stored in advance, and a user can easily search for the information that the user wants to know by operating the operating buttons 2203. Moreover, a washing method can be additionally recorded in accordance with the user's preference.

Figure 19A:
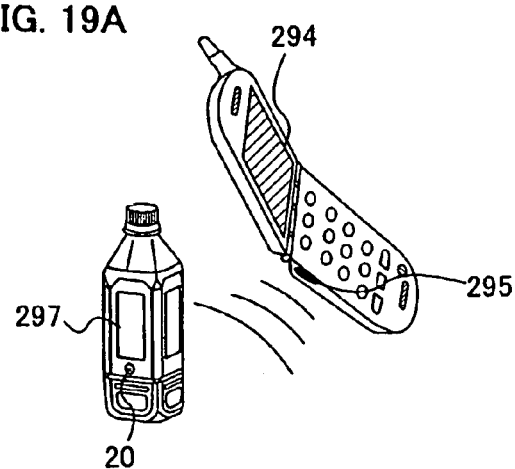
FIGS. 19A and 19B describe usage patterns of a semiconductor device of the present invention.
Figure 19B:
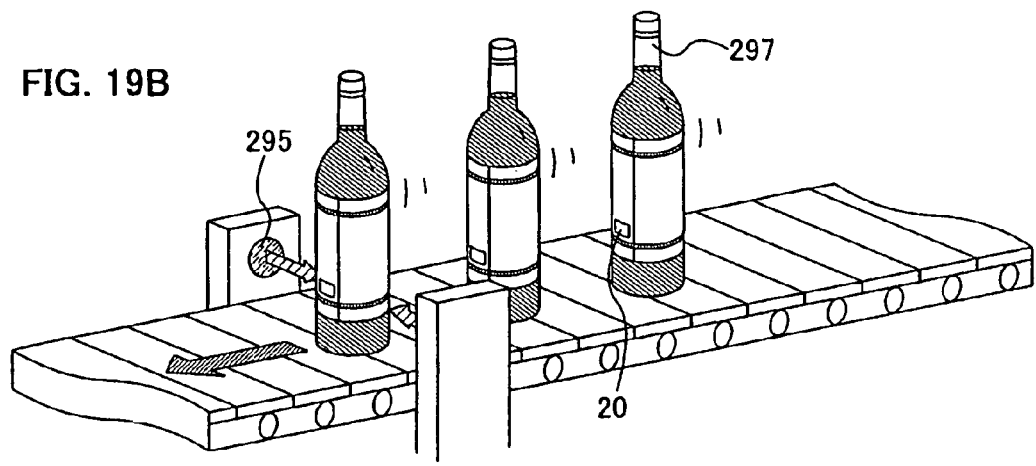

Subsequently, an example of a system using the semiconductor device of the present invention is described. First, a reader/writer 295 is provided at a side surface of a mobile terminal including a display portion 294 and the semiconductor device 20 of the present invention is provided at a side surface of an object 297 (refer to FIG. 19A). In addition, information of the object 297 such as a material, a production area, or a history of a circulation process is stored in the semiconductor device 20 in advance. Then, the information in the semiconductor device 20 is displayed in the display portion 294 when the semiconductor device 20 is held over the reader/writer 295. Thus, a useful system can be provided. As another example, the reader/writer 295 is provided beside a belt conveyer (refer to FIG. 19B). Then, a system which can inspect the object 297 very easily can be provided. In this way, by using the semiconductor device of the present invention for management or a circulation system of objects, the system can become more sophisticated and useful.

Embodiment 4

This embodiment describes a measurement result of a current-voltage characteristic when data are written by an electric action in a storage element formed over a substrate with reference to FIGS. 20A and 20B, FIGS. 21A and 21B, and FIGS. 22A and 22B. In each of FIGS. 20A and 20B, FIGS. 21A and 21B, and FIGS. 22A and 22B, the horizontal axis shows a voltage value, the vertical axis shows a current density value, a circular mark plot shows a measurement result of a current-voltage characteristic of a storage element before the data are written therein, and a square mark plot shows a measurement result of a current-voltage characteristic of a storage element after the data are written therein. To write the data in the storage element by an electric action means to apply voltage to the storage element to short the storage element.

Six samples (samples 1 to 6) are used to measure the current-voltage characteristic. The size of each of the six samples in its horizontal plane is 2 mm×2 mm. Multilayer structures of the six samples are described hereinafter.

Figure 20A:
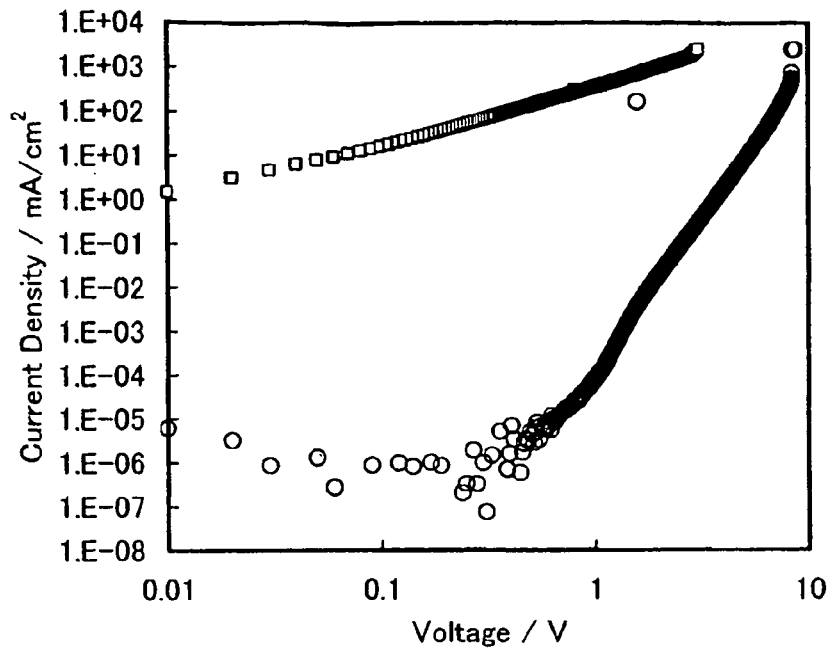
FIGS. 20A and 20B show a current-voltage characteristic of a storage element.

The sample 1 is an element formed by stacking a first conductive layer, an organic compound layer, and a second conductive layer in order. In the sample 1, the first conductive layer is formed with ITO containing silicon oxide, the organic compound layer is formed with TPD, and the second conductive layer is formed with aluminum. The organic compound layer is formed in 50 nm thick. FIG. 20A shows a measurement result of the current-voltage characteristic of the sample 1.

Figure 20B:
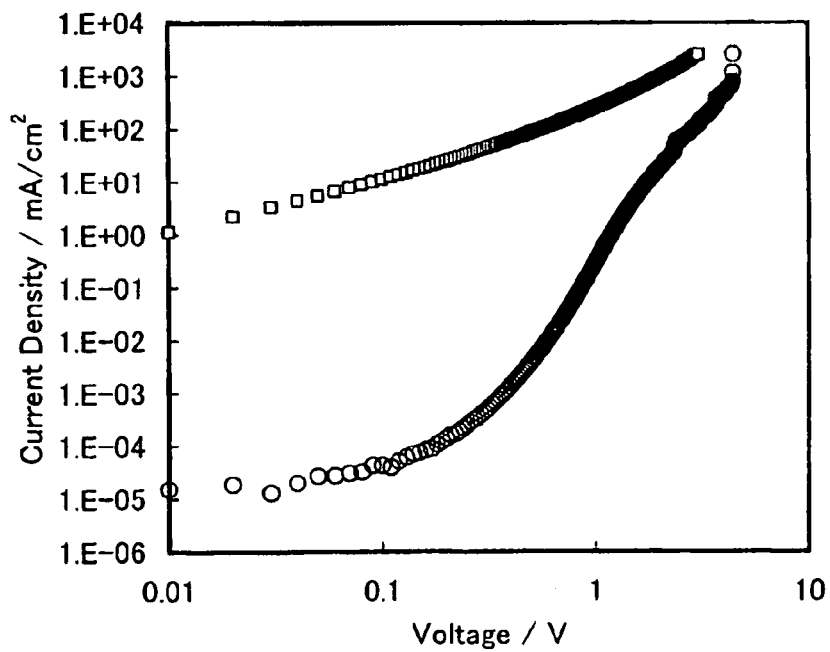

The sample 2 is an element formed by stacking a first conductive layer, an organic compound layer, and a second conductive layer in order. In the sample 2, the first conductive layer is formed with ITO containing silicon oxide, the organic compound layer is formed with TPD in which 2,3,5,6-tetrafluoro-7,7,8,8-tetracyanoquinodimenthane (sometimes abbreviated to F4-TCNQ) is added, and the second conductive layer is formed with aluminum. The organic compound layer is formed in 50 nm thick and formed by adding F4-TCNQ for 0.01 wt %. FIG. 20B shows a measurement result of the current-voltage characteristic of the sample 2.

Figure 21A:
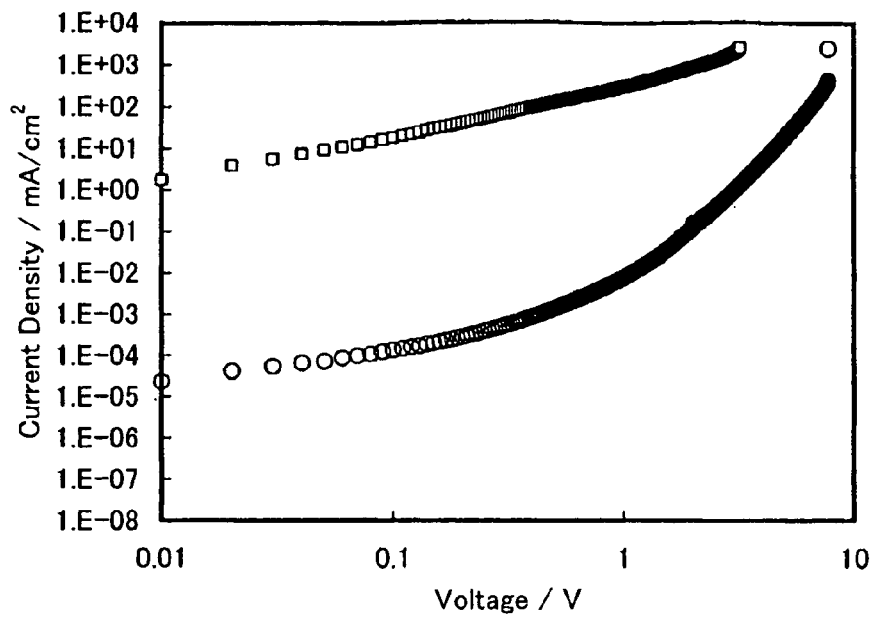
FIGS. 21A and 21B show a current-voltage characteristic of a storage element.

The sample 3 is an element formed by stacking a first conductive layer, a first organic compound layer, a second organic compound layer, and a second conductive layer in order. In the sample 3, the first conductive layer is formed with ITO containing silicon oxide, the first organic compound layer is formed with TPD, the second organic compound layer is formed with F4-TCNQ, and the second conductive layer is formed with aluminum. The first organic compound layer is formed in 50 nm thick, and the second organic compound layer is formed in 1 nm. FIG. 21A shows a measurement result of the current-voltage characteristic of the sample 3.

Figure 21B:
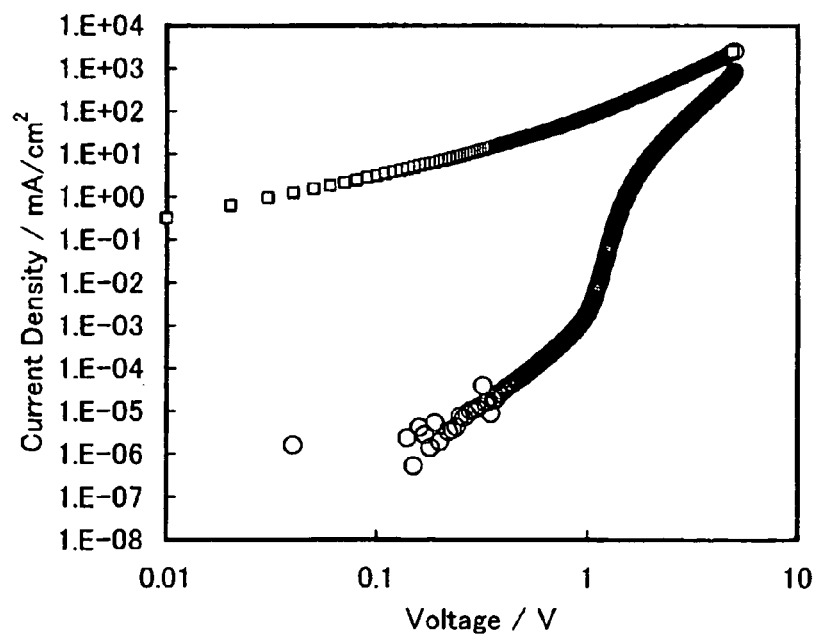

The sample 4 is an element formed by stacking a first conductive layer, a first organic compound layer, a second organic compound layer, and a second conductive layer in order. In the sample 4, the first conductive layer is formed with ITO containing silicon oxide, the first organic compound layer is formed with F4-TCNQ, the second organic compound layer is formed with TPD, and the second conductive layer is formed with aluminum. The first organic compound layer is formed in 1 nm thick, and the second organic compound layer is formed in 50 nm. FIG. 21B shows a measurement result of the current-voltage characteristic of the sample 4.

Figure 22A:
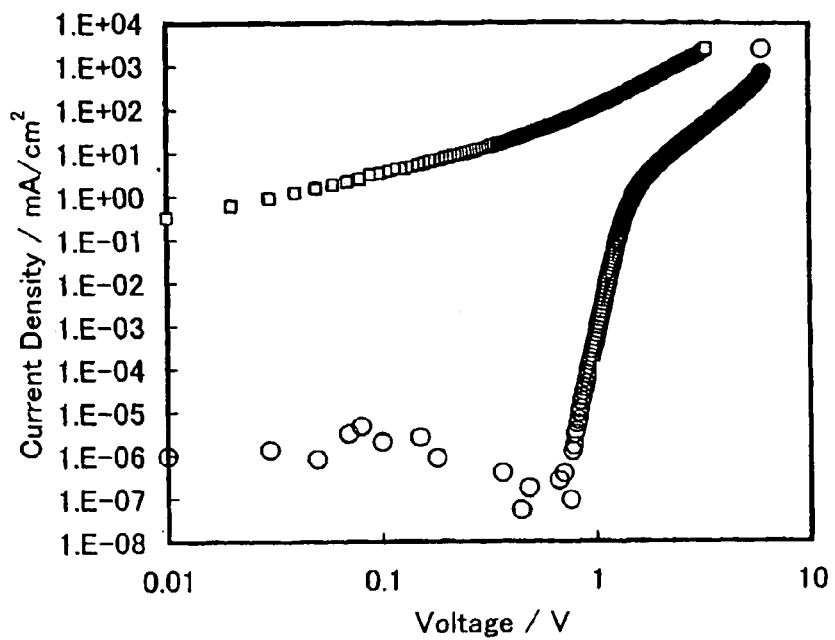
FIGS. 22A and 22B show a current-voltage characteristic of a storage element.

The sample 5 is an element formed by stacking a first conductive layer, a first organic compound layer, a second organic compound layer, and a second conductive layer in order. In the sample 5, the first conductive layer is formed with ITO containing silicon oxide, the first organic compound layer is formed with TPD in which F4-TCNQ is added, the second organic compound layer is formed with TPD, and the second conductive layer is formed with aluminum. The first organic compound layer is formed in 40 nm thick by adding F4-TCNQ for 0.01 wt %, and the second organic compound layer is formed in 40 nm. FIG. 22A shows a measurement result of the current-voltage characteristic of the sample 5.

Figure 22B:
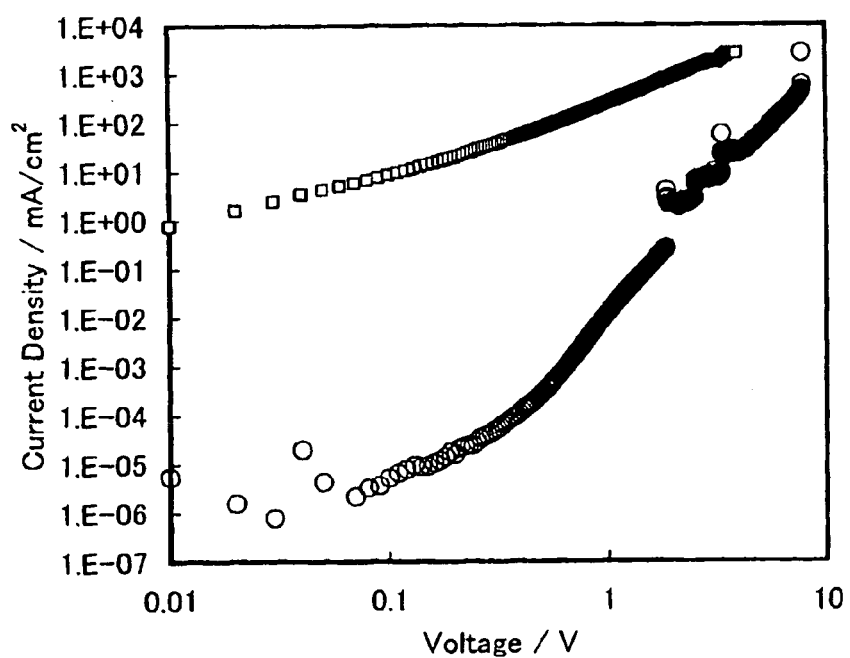

The sample 6 is an element formed by stacking a first conductive layer, a first organic compound layer, a second organic compound layer, and a second conductive layer in order. In the sample 6, the first conductive layer is formed with ITO containing silicon oxide, the first organic compound layer is formed with TPD, the second organic compound layer is formed with TPD in which F4-TCNQ is added, and the second conductive layer is formed with aluminum. The first organic compound layer is formed in 40 nm thick, and the second organic compound layer is formed in 10 nm thick by adding F4-TCNQ for 0.01 wt %. FIG. 22B shows a measurement result of the current-voltage characteristic of the sample 6.

According to the measurement results shown in FIGS. 20A and 20B, FIGS. 21A and 21B, and FIGS. 22A and 22B, the current-voltage characteristic of the storage element drastically changes through the samples 1 to 6 before and after writing the data (before and after shorting the storage element).

The writing voltage (V) is 8.4 in the sample 1, 4.4 in the sample 2, 3.2 in the sample 3, 5.0 in the sample 4, 6.1 in the sample 5, and 7.8 in the sample 6. The writing voltage in the samples 1 to 6 has repeatability and the margin of error is within 0.1 V.

Next, the change of the current density before and after writing the data in the samples 1 to 6 is described. A value R1 showing the change of the current density is obtained by dividing current density A when a voltage of 1 V is applied to the storage element after the writing by current density B when a voltage of 1 V is applied to the storage element before the writing (R1=A+B). A value R2 is obtained by dividing current density C when a voltage of 3 V is applied to the storage element after the writing by current density D when a voltage of 3 V is applied to the storage element before the writing (R2=C+D).

R1 is $1.9\times10^7$ and R2 is $8.4\times10^3$ in the sample 1, R1 is $8.0\times10^8$ and R2 is $2.1\times10^2$ in the sample 2, R1 is $8.7\times10^4$ and R2 is $2.0\times10^2$ in the sample 3, R1 is $3.7\times10^4$ and R2 is $1.0\times10^1$ in the sample 4, R1 is $2.0\times10^5$ and R2 is $5.9\times10^1$ in the sample 5, and R1 is $2.0\times10^4$ and R2 is $2.5\times10^2$ in the sample 6. From the above results, the change of the current value when the applied voltage is 1 V is $10^3$ times or more higher than the change of the current value when the applied voltage is 3 V.

EXPLANATION OF REFERENCES

11: POWER SOURCE CIRCUIT, 12: CLOCK GENERATION CIRCUIT, 13: DATA MODULATION/DEMODULATION CIRCUIT, 14: CONTROL CIRCUIT, 15: INTERFACE CIRCUIT, 16: STORAGE CIRCUIT, 17: DATA BUS, 18: ANTENNA, 19: READER/WRITER, 20: SEMICONDUCTOR DEVICE, 21: MEMORY CELL, 22: MEMORY CELL ARRAY, 23: DECODER, 24: DECODER, 25: SELECTOR, 26: READ/WRITE CIRCUIT, 27: FIRST CONDUCTIVE LAYER, 28: SECOND CONDUCTIVE LAYER, 29: ORGANIC COMPOUND LAYER, 30: STORAGE ELEMENT, 31: FIELD-EFFECT TRANSISTOR, 32: LASER IRRADIATION APPARATUS, 33: INSULATING LAYER, 34: INSULATING LAYER, 44: SEMICONDUCTOR LAYER, 45: SEMICONDUCTOR LAYER, 46: RESISTOR ELEMENT, 47: SENSE AMPLIFIER, 261: PLOT, 262: PLOT, 271: PLOT, 272: PLOT, 294: DISPLAY PORTION, 295: READER/WRITER, 297: OBJECT, 301: INSULATING LAYER, 302: SINGLE-CRYSTAL SEMICONDUCTOR LAYER, 303: N WELL, 304: P WELL, 305: N WELL, 306: P WELL, 307: FIELD OXIDE LAYER, 308: GATE INSULATING LAYER, 309: GATE INSULATING LAYER, 310: GATE INSULATING LAYER, 311: GATE INSULATING LAYER, 312: GATE, 313: GATE, 314: GATE, 315: GATE, 312a: POLYCRYSTALLINE SILICON LAYER, 313a: POLYCRYSTALLINE SILICON LAYER, 314a: POLYCRYSTALLINE SILICON LAYER, 315a: POLYCRYSTALLINE SILICON LAYER, 312b: SILICIDE LAYER, 313b: SILICIDE LAYER, 314b: SILICIDE LAYER, 315b: SILICIDE LAYER, 316: FET, 317: FET, 318: FET, 319: FET, 320: LOW-CONCENTRATION IMPURITY REGION, 321: LOW-CONCENTRATION IMPURITY REGION, 322: LOW-CONCENTRATION IMPURITY REGION, 323: LOW-CONCENTRATION IMPURITY REGION, 324: SIDEWALL, 325: SIDEWALL, 326: SIDEWALL, 327: SIDEWALL, 328: IMPURITY REGION, 329: IMPURITY REGION, 330: IMPU-

RITY REGION, 331: IMPURITY REGION, 332: INSULATING LAYER, 333: INSULATING LAYER, 334: CONDUCTIVE LAYER, 335: CONDUCTIVE LAYER 336: CONDUCTIVE LAYER 337: CONDUCTIVE LAYER 338: CONDUCTIVE LAYER 339: CONDUCTIVE LAYER 341: CONDUCTIVE LAYER 342: CONDUCTIVE LAYER 343: CONDUCTIVE LAYER 345: FIRST CONDUCTIVE LAYER, 346: ORGANIC COMPOUND LAYER, 347: SECOND CONDUCTIVE LAYER, 348: INSULATING LAYER, 349: INSULATING LAYER, 350: STORAGE ELEMENT, 351: LAYER, 352: LAYER, 361: FIRST CONDUCTIVE LAYER, 362: FIRST CONDUCTIVE LAYER, 363: FIRST CONDUCTIVE LAYER, 364: FIRST CONDUCTIVE LAYER, 365: ORGANIC COMPOUND LAYER, 366: ORGANIC COMPOUND LAYER, 367: ORGANIC COMPOUND LAYER, 368: ORGANIC COMPOUND LAYER, 369: SECOND CONDUCTIVE LAYER, 370: INSULATING LAYER, 371: STORAGE ELEMENT, 372: STORAGE ELEMENT, 373: STORAGE ELEMENT, 374: STORAGE ELEMENT, 375: INSULATING LAYER, 401: LAYER, 402: LAYER, 403: CONDUCTIVE LAYER, 445: FIRST CONDUCTIVE LAYER, 446: ORGANIC COMPOUND LAYER, 447: SECOND CONDUCTIVE LAYER, 448: INSULATING LAYER, 449: INSULATING LAYER, 450: STORAGE ELEMENT, 462: FIRST CONDUCTIVE LAYER, 463: FIRST CONDUCTIVE LAYER, 466: ORGANIC COMPOUND LAYER, 467: ORGANIC COMPOUND LAYER, 469: SECOND CONDUCTIVE LAYER, 470: INSULATING LAYER, 472: STORAGE ELEMENT, 473: STORAGE ELEMENT, 475: INSULATING LAYER, 501: LAYER, 502: LAYER, 503: CONDUCTIVE LAYER, 504: SUBSTRATE, 505: RESIN, 506: CONDUCTIVE PARTICLE, 510: SIMOX SUBSTRATE, 511: FIRST SINGLE-CRYSTAL SEMICONDUCTOR LAYER, 512: INSULATING LAYER, 513: SECOND SINGLE-CRYSTAL SEMICONDUCTOR LAYER, 514: LAYER, 515: GRINDING AND POLISHING APPARATUS, 516: SEMICONDUCTOR DEVICE, 517: CONDUCTIVE LAYER, 518: SUBSTRATE, 520: OBJECT, 1001: LASER IRRADIATION APPARATUS, 1002: COMPUTER, 1003: LASER OSCILLATOR, 1004: POWER SOURCE, 1005: OPTICAL SYSTEM, 1006: ACOUSTO-OPTIC MODULATOR, 1007: OPTICAL SYSTEM, 1009: MOVING MECHANISM, 1010: CONVERTER, 1011: DRIVER, 1012: DRIVER, 1013: AUTOFOCUSING MECHANISM, 1014: SUBSTRATE, 2001: CASE, 2002: DISPLAY PORTION, 2003: OPERATION BUTTONS, 2101: CASE, 2102: DISPLAY PORTION, 2103: OPERATION BUTTONS, 2201: CASE, 2202: DISPLAY PORTION, 2203: OPERATION BUTTONS, 2700: CASE, 2701: PANEL, 2702: HOUSING, 2703: PRINT WIRING SUBSTRATE, 2704: OPERATION BUTTONS, 2705: BATTERY, 2706: CASE, 2708: CONNECTION FILM, 2709: PIXEL REGION

The invention claimed is:

1. A semiconductor device comprising:
a plurality of field-effect transistors each of which is provided over a first insulating layer and uses a single-crystal semiconductor layer as a channel portion;
a second insulating layer covering the plurality of field-effect transistors;
a third insulating layer formed over the second insulating layer;
a first conductive layer connected to one of a source region and a drain region of one of the plurality of field-effect transistors through a first opening portion provided in the second insulating layer and the third insulating layer;
a second conductive layer connected to one of a source region and a drain region of another one of the plurality of field-effect transistors through a second opening portion provided in the second insulating layer and the third insulating layer;
a fourth insulating layer formed over the first conductive layer and the second conductive layer;
an organic compound layer formed in a third opening portion provided in the fourth insulating layer and over the first conductive layer; and
a third conductive layer covering the organic compound layer,
wherein the first conductive layer and the second conductive layer are provided in the same layer, and
wherein the second conductive layer is an antenna.

2. The semiconductor device according to claim 1,
wherein the first insulating layer is a silicon oxide layer.

3. The semiconductor device according to claim 1,
wherein the semiconductor device further comprises a fifth insulating layer over the third conductive layer.

4. The semiconductor device according to claim 1,
wherein a thickness of the organic compound layer is equal to or greater than 10 nm and equal to or less than 20 nm.

5. The semiconductor device according to claim 1,
wherein the second conductive layer is fully covered by the fourth insulating layer.

6. A semiconductor device comprising:
a plurality of field-effect transistors each of which uses a single-crystal semiconductor layer as a channel portion;
an insulating layer covering the plurality of field-effect transistors;
a first conductive layer over the insulating layer, the first conductive layer being connected to one of a source region and a drain region of one of the plurality of field-effect transistors;
a second conductive layer over the insulating layer, the second conductive layer being connected to one of a source region and a drain region of another one of the plurality of field-effect transistors;
an organic compound layer formed over the first conductive layer; and
a third conductive layer covering the organic compound layer,
wherein the first conductive layer and the second conductive layer are provided in the same layer, and
wherein the second conductive layer is an antenna.

7. The semiconductor device according to claim 6,
wherein the thickness of the organic compound layer is equal to or greater than 10 nm and equal to or less than 20 nm.

8. The semiconductor device according to claim 6,
wherein the insulating layer is a silicon oxide layer.

9. The semiconductor device according to claim 6,
wherein the semiconductor device further comprises a second insulating layer over the third conductive layer.

10. The semiconductor device according to claim 6,
wherein the semiconductor device further comprises a second insulating layer over the first conductive layer and the second conductive layer, and
wherein the second conductive layer is fully covered by the second insulating layer.

11. The semiconductor device according to any one of claims 1 and 6,
wherein the organic compound layer has a carrier-transporting material.

12. The semiconductor device according to any one of claims 1 and 6,
   wherein the organic compound layer has a carrier-transporting material, and
   wherein a conductance of the organic compound layer ranges from $1.0 \times 10^{-15}$ S·cm$^{-1}$ to $1.0 \times 10^{-3}$ S·cm$^{-1}$.

13. The semiconductor device according to any one of claims 1 and 6,
   wherein the organic compound layer has a conjugate polymer material.

14. The semiconductor device according to any one of claims 1 and 6,
   wherein the organic compound layer has an electron-transporting material or a hole-transporting material.

15. The semiconductor device according to any one of claims 1 and 6,
   wherein the first conductive layer is in contact with the organic compound layer.

16. The semiconductor device according to any one of claims 1 and 6,
   wherein the third conductive layer is aluminum.

* * * * *